(12) United States Patent
Hung et al.

(10) Patent No.: US 10,049,918 B2
(45) Date of Patent: Aug. 14, 2018

(54) DIRECTIONAL PATTERNING METHODS

(71) Applicant: Taiwan Semiconductor Manufacturing Co., Ltd., Hsin-Chu (TW)

(72) Inventors: Chi-Cheng Hung, Miaoli County (TW); Ru-Gun Liu, Hsinchu County (TW); Wei-Liang Lin, Hsin-Chu (TW); Ta-Ching Yu, Zhubei (TW); Yung-Sung Yen, New Taipei (TW); Ziwei Fang, Hsinchu (TW); Tsai-Sheng Gau, HsinChu (TW); Chin-Hsiang Lin, Hsin-Chu (TW); Kuei-Shun Chen, Hsinchu (TW)

(73) Assignee: TAIWAN SEMICONDUCTOR MANUFACTURING CO., LTD., Hsin-Chu (TW)

( * ) Notice: Subject to any disclaimer, the term of this patent is extended or adjusted under 35 U.S.C. 154(b) by 0 days.

(21) Appl. No.: 15/395,310

(22) Filed: Dec. 30, 2016

(65) Prior Publication Data

US 2018/0090370 A1 Mar. 29, 2018

(51) Int. Cl.
*H01L 21/311* (2006.01)
*H01L 21/768* (2006.01)
*H01L 21/033* (2006.01)
*H01L 21/3115* (2006.01)

(52) U.S. Cl.
CPC .... *H01L 21/76816* (2013.01); *H01L 21/0332* (2013.01); *H01L 21/0337* (2013.01); *H01L 21/31144* (2013.01); *H01L 21/31155* (2013.01)

(58) Field of Classification Search
None
See application file for complete search history.

(56) References Cited

U.S. PATENT DOCUMENTS

| | | |
|---|---|---|
| 6,673,199 B1 | 1/2004 | Yamartino et al. |
| 8,084,358 B2 | 12/2011 | Yoshida |
| 8,975,189 B2 | 3/2015 | Lu et al. |
| 9,082,830 B2 | 7/2015 | Yeh |

(Continued)

*Primary Examiner* — Angel Roman
(74) *Attorney, Agent, or Firm* — Haynes and Boone, LLP

(57) ABSTRACT

Directional patterning methods are disclosed herein. An exemplary method includes performing a lithography process to form a pattered hard mask layer over a wafer, wherein the patterned hard mask layer includes a hard mask feature having an associated horizontally-defined characteristic; tuning an etching process to direct etching species in a substantially horizontal direction relative to a horizontal surface of the wafer, such that the etching process horizontally removes portions of the patterned hard mask layer, thereby modifying the horizontally-defined characteristic of the hard mask feature; and forming an integrated circuit feature that corresponds with the hard mask feature having the modified horizontally-defined characteristic. Horizontally-defined characteristic can include a length, a width, a line edge roughness, a line width roughness, a line end profile, other horizontally-defined characteristics, or combinations thereof. In some implementations, the directional patterning method disclosed herein can achieve oblique interconnects and/or slot (rectangular) via interconnects.

20 Claims, 14 Drawing Sheets

(56) References Cited

U.S. PATENT DOCUMENTS

| | | |
|---|---|---|
| 9,204,538 B2 | 12/2015 | Lee et al. |
| 2008/0102570 A1* | 5/2008 | Fischer ............. H01L 29/66818 |
| | | 438/157 |
| 2010/0055917 A1* | 3/2010 | Kim .................. H01L 21/30655 |
| | | 438/706 |
| 2011/0049098 A1 | 3/2011 | Koiwa |
| 2014/0080306 A1* | 3/2014 | Lu ..................... H01L 21/31058 |
| | | 438/703 |
| 2014/0120729 A1 | 5/2014 | Liu et al. |
| 2015/0083581 A1 | 3/2015 | Sherman et al. |
| 2015/0228497 A1 | 8/2015 | Schepper et al. |

* cited by examiner

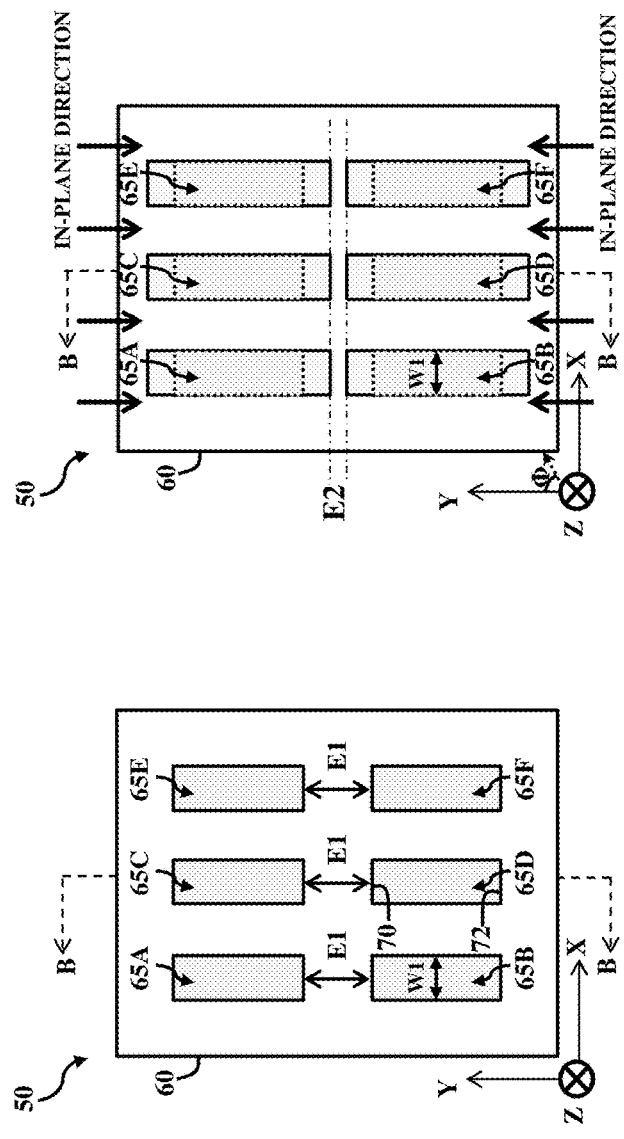
FIG. 3A
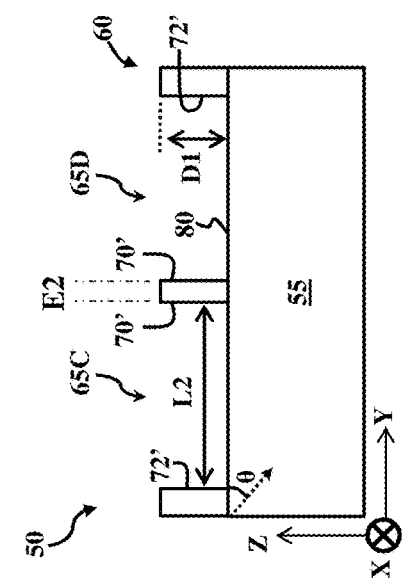
FIG. 3B
FIG. 2A
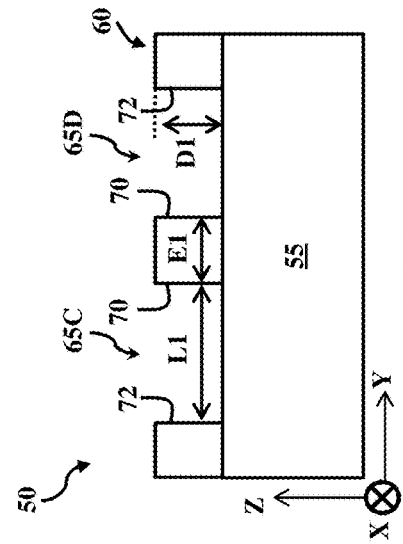
FIG. 2B

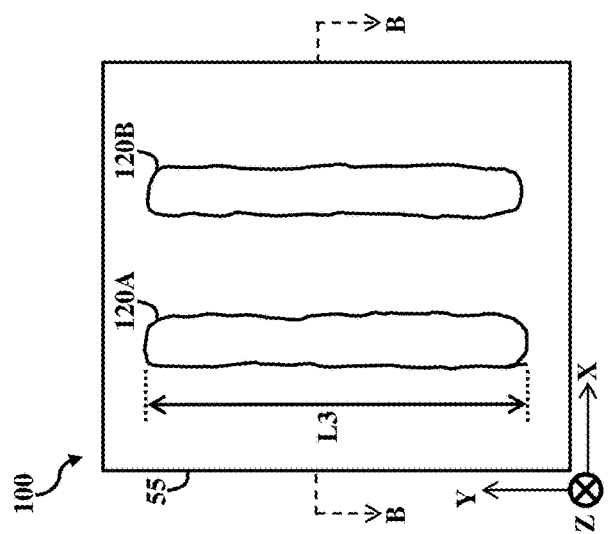
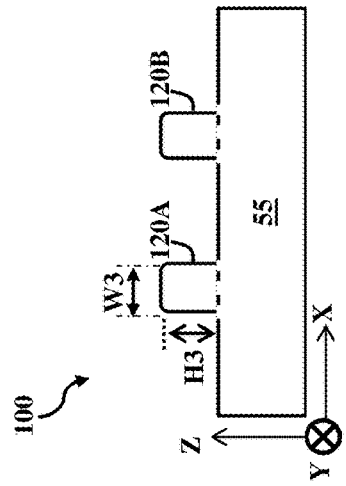
FIG. 7A
FIG. 7B

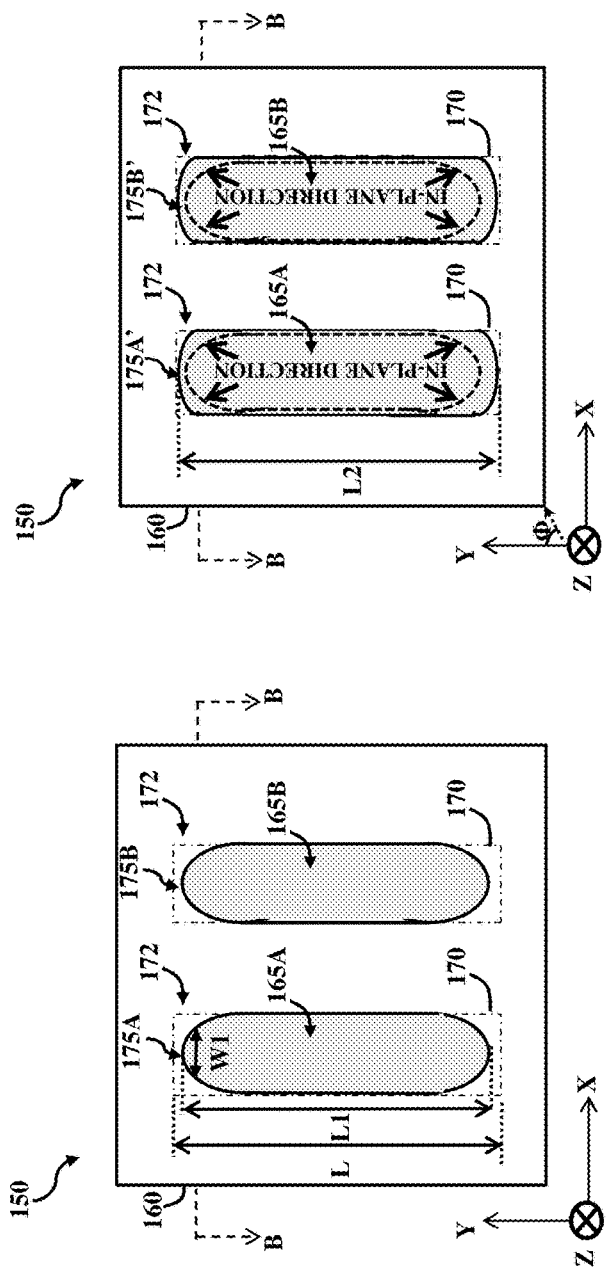
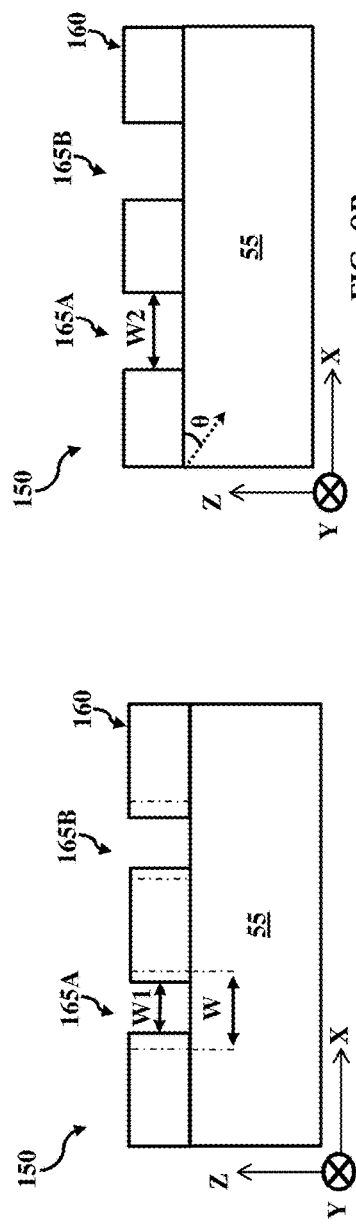
FIG. 9A
FIG. 9B
FIG. 8A
FIG. 8B

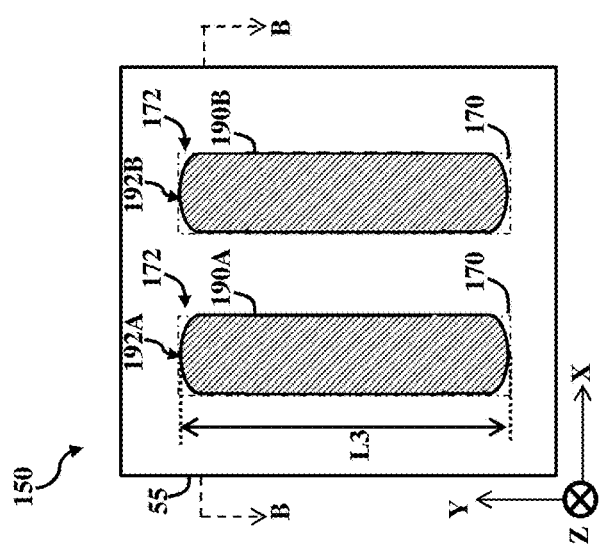
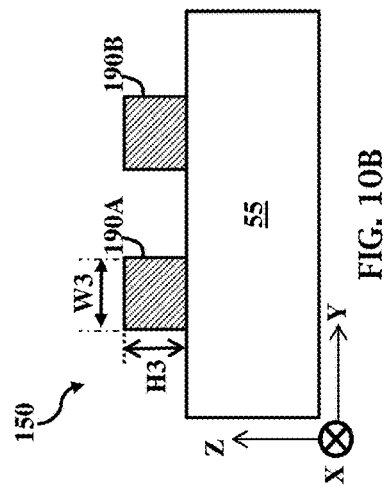
FIG. 10A
FIG. 10B

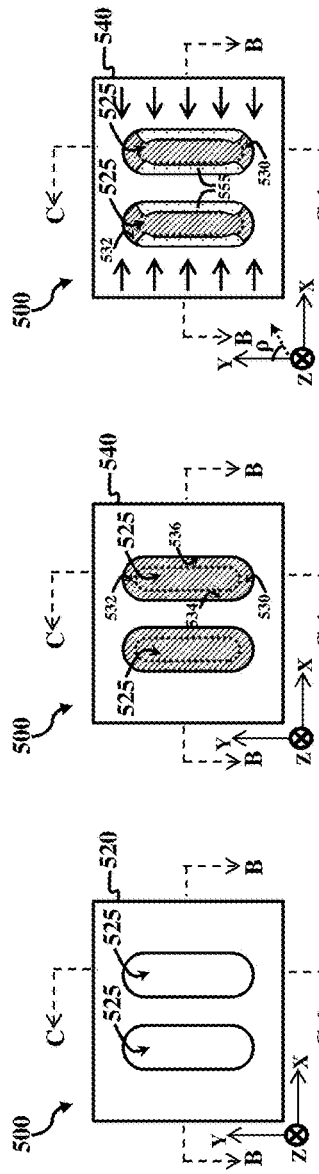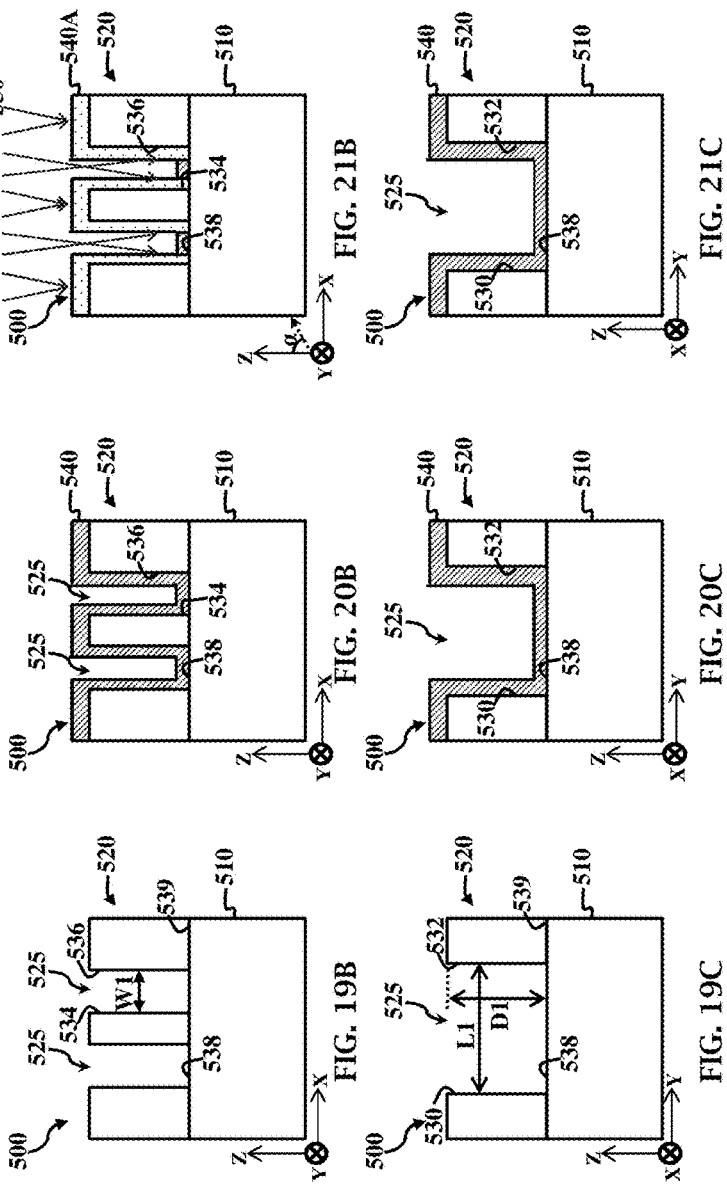

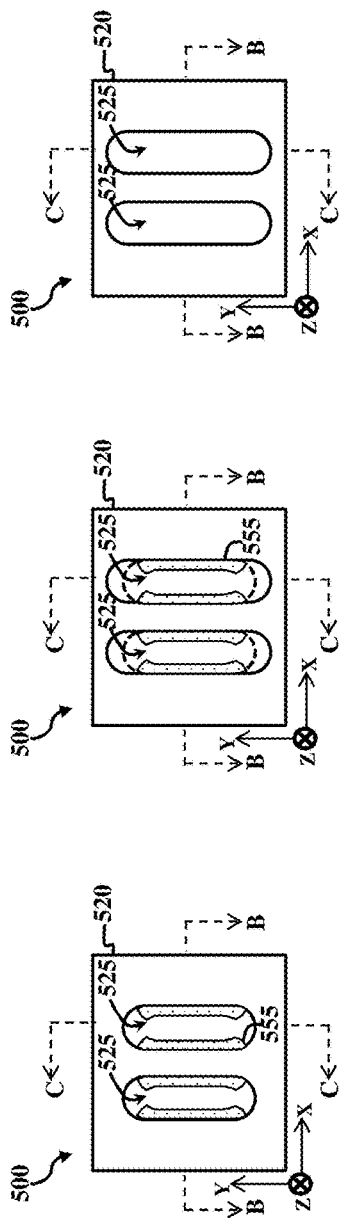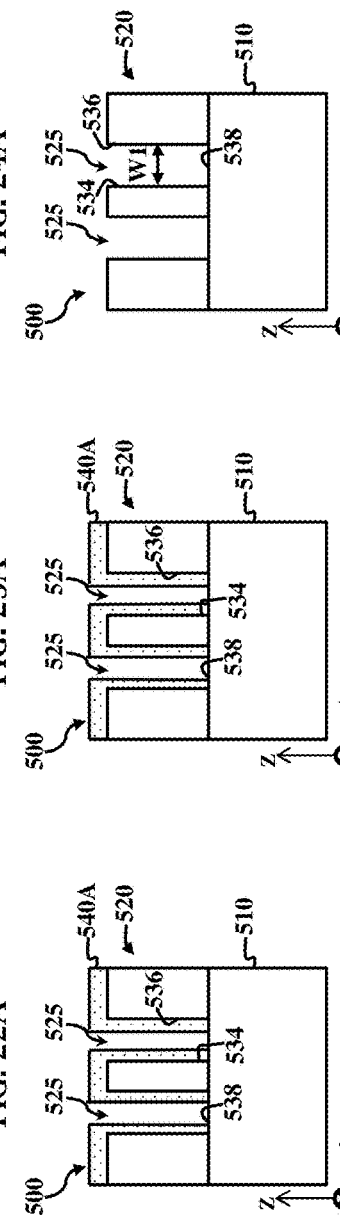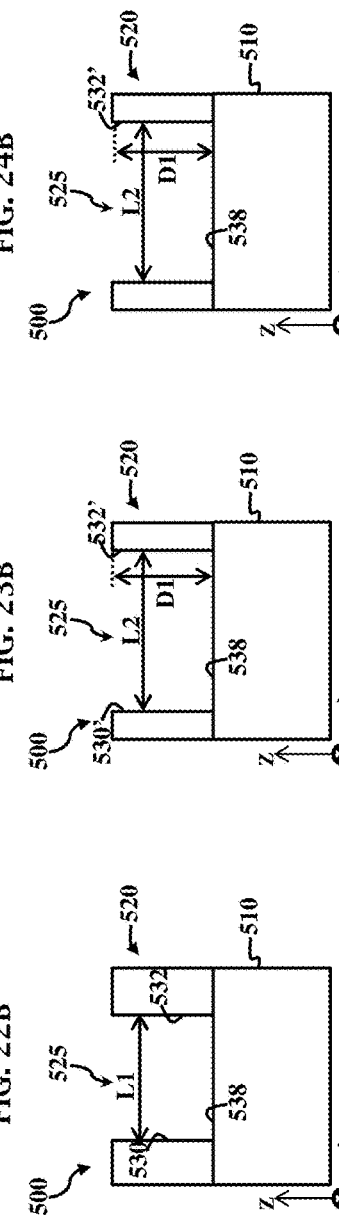

US 10,049,918 B2

DIRECTIONAL PATTERNING METHODS

PRIORITY INFORMATION

This application claims priority to U.S. Provisional Patent Application Ser. No. 62/401,602 filed on Sep. 29, 2016, the entire disclosure of which is hereby incorporated herein by reference.

BACKGROUND

Integrated circuit (IC) design becomes more challenging as IC technologies continually progress towards smaller feature sizes, such as 32 nanometers, 28 nanometers, 20 nanometers, and below. For example, smaller feature sizes require ever shrinking pitch (i.e., a center-to-center distance between IC features) and critical dimension (i.e., a smallest achievable dimension, such as a width, for an IC feature). Current resolution of lithography processes—an ability of the lithography processes to resolve detail in an IC feature being patterned—hinders realization of the smaller feature sizes required for advanced technology nodes. Accordingly, although existing lithography processes have been generally adequate for their intended purposes, they have not been entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

FIGS. 2A-4A and FIGS. 2B-4B are fragmentary diagrammatic views of a semiconductor device, in portion or entirety, at various fabrication stages (such as those associated with the method of FIG. 1) according to various aspects of the present disclosure.

FIGS. 5A-7A and FIGS. 5B-7B are fragmentary diagrammatic views of another semiconductor device, in portion or entirety, at various fabrication stages (such as those associated with the method of FIG. 1) according to various aspects of the present disclosure.

FIGS. 8A-10A and FIGS. 8B-10B are fragmentary diagrammatic views of yet another semiconductor device, in portion or entirety, at various fabrication stages (such as those associated with method 10) according to various aspects of the present disclosure.

FIGS. 11A-14A and FIGS. 11B-14B are fragmentary diagrammatic views of yet another semiconductor device, in portion or entirety, at various fabrication stages (such as those associated with the method of FIG. 1) according to various aspects of the present disclosure.

FIGS. 15A-17A and FIGS. 15B-17B are fragmentary diagrammatic views of yet another semiconductor device, in portion or entirety, at various fabrication stages (such as those associated with the method of FIG. 1) according to various aspects of the present disclosure.

FIGS. 19A-24A, FIGS. 19B-24B, and FIGS. 19C-24C are fragmentary diagrammatic views of yet another semiconductor device, in portion or entirety, at various fabrication stages (such as those associated with the method of FIG. 18) according to various aspects of the present disclosure.

DETAILED DESCRIPTION

Figure 1:
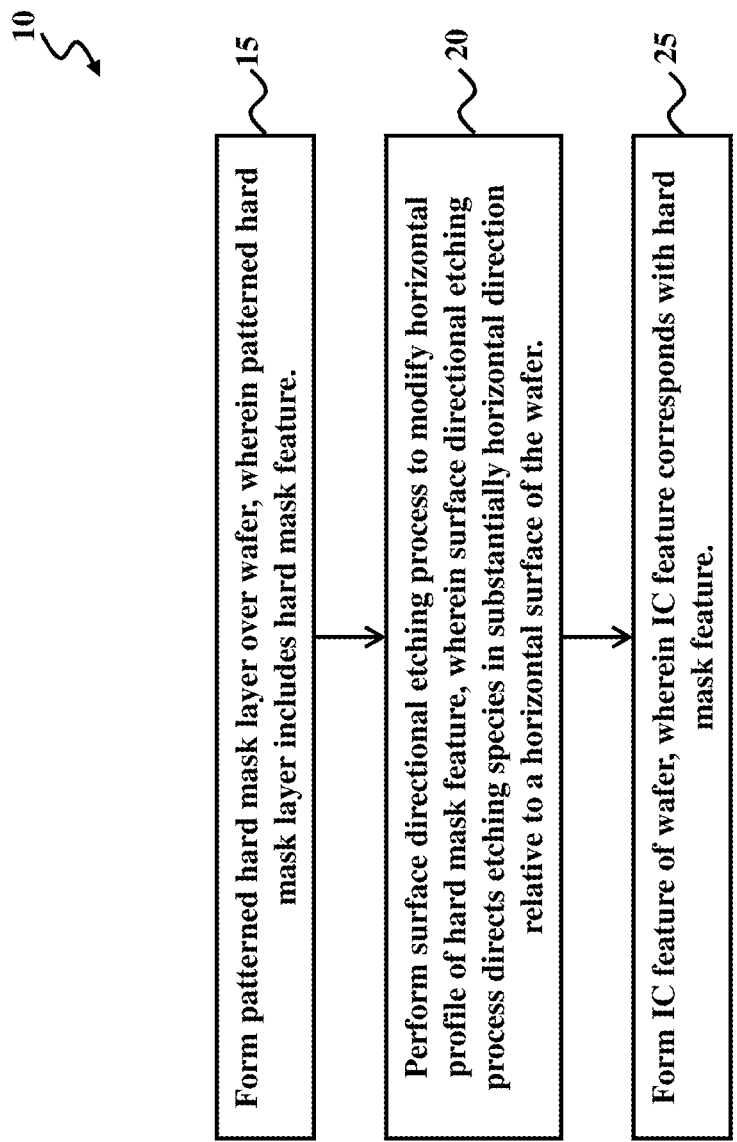
FIG. 1 is a flow chart of a directional patterning method, which can be implemented for fabricating semiconductor devices, according to various aspects of the present disclosure.

The present disclosure relates generally to lithography processes, and more particularly, to directional patterning processes.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

In addition, the present disclosure may repeat reference numerals and/or letters in the various examples. This repetition is for the purpose of simplicity and clarity and does not in itself dictate a relationship between the various embodiments and/or configurations discussed. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact. In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features.

FIG. 1 is a flow chart of a directional patterning method 10, which can be implemented when fabricating semiconductor devices, according to various aspects of the present disclosure. At block 15, a patterned hard mask layer is formed over a wafer. The patterned hard mask feature includes a hard mask feature, such as an opening or a line. In some implementations, the hard mask feature corresponds with an integrated circuit (IC) feature to be formed for a semiconductor device. At block 20, a surface directional etching process is performed to modify a horizontal profile of the hard mask feature. The surface directional etching process directs etching species in a substantially horizontal direction relative to a horizontal surface of the wafer. At block 25, an IC feature is formed on and/or in the wafer. The IC feature corresponds with the hard mask feature. Additional steps can be provided before, during, and after method 10, and some of the steps described can be moved, replaced, or eliminated for additional embodiments of method 10.

Turning to FIGS. 2A-4A and FIGS. 2B-4B, surface directional etching can be implemented to push end-to-end spacing between IC features below lithography process resolution limits without using an end-cut mask. FIGS. 2A-4A and FIGS. 2B-4B are fragmentary diagrammatic views of a semiconductor device 50, in portion or entirety, at various fabrication stages (such as those associated with method 10)

according to various aspects of the present disclosure. In particular, FIGS. 2A-4A are top views of semiconductor device 50, and FIGS. 2B-4B are diagrammatic cross-sectional views of semiconductor device 50 along line B-B in respective FIGS. 2A-4A. Semiconductor device 50 may be a portion of an integrated circuit (IC) chip, a system on chip (SoC), or portion thereof, that includes various passive and active microelectronic devices, such as resistors, capacitors, inductors, fuses, diodes, P-channel field effect transistors (PFETs), N-channel field effect transistors (NFETs), metal-oxide-semiconductor FETs (MOSFETs), complementary MOS (CMOS) transistors, high voltage transistors, high frequency transistors, other suitable components, or combinations thereof. FIGS. 2A-4A and FIGS. 2B-4B have been simplified for the sake of clarity to better understand the inventive concepts of the present disclosure. Additional features can be added in semiconductor device 50, and some of the features described below can be replaced, modified, or eliminated in other embodiments of semiconductor device 50.

In FIG. 2A and FIG. 2B, semiconductor device 50 includes a wafer 55, which includes various material layers (for example, dielectric material layers, semiconductor material layers, and/or conductive material layers) and/or IC features (for example, doped regions/features, gate features, and/or interconnect features) depending on IC fabrication stage. In the depicted embodiment, wafer 55 includes various material layers and/or IC features formed on and/or in a silicon substrate. Alternatively or additionally, the substrate includes another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. Alternatively, the substrate is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods.

A patterned hard mask layer 60 is formed over wafer 55 by any suitable process. In some implementations, forming patterned hard mask layer 60 includes forming a hard mask layer over wafer 55 (for example, by a chemical vapor deposition (CVD) process) and performing a lithography process to form a pattern in the hard mask layer. The lithography process can include forming a resist layer over the hard mask layer (for example, by spin coating), performing a pre-exposure baking process, performing an exposure process using a mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light), where the mask blocks radiation from and/or transmits radiation to the resist layer depending on a final mask pattern of the mask (which corresponds with a target wafer pattern defined by an IC design layout), such that an image is projected onto the resist layer that corresponds with the final mask pattern. Since the resist layer is sensitive to radiation energy, exposed portions of the resist layer chemically change, such that exposed portions of the resist layer correspond with the image. Alternatively, the exposure process is assisted, implemented, or replaced by other methods, such as maskless lithography, electron-beam writing, or ion-beam writing. Exposed (or non-exposed) portions of the resist layer are dissolved during the developing process depending on characteristics of the resist layer and characteristics of a developing solution. After development, the patterned resist layer includes a resist pattern that corresponds with a pattern to be formed in the hard mask layer. The lithography process further includes transferring the resist pattern defined in the patterned resist layer to the hard mask layer, resulting in patterned hard mask layer 60. In some implementations, an etching process is performed that removes portions of the hard mask layer, where the etching process uses the patterned resist layer as an etch mask during the etching process. The etching process includes wet etching processes, dry etching processes, other etching processes, or combinations thereof. Thereafter, the patterned resist layer is removed from the wafer, for example, by a resist stripping process.

Patterned hard mask layer 60 includes silicon oxide, silicon nitride, silicon carbide, other suitable hard mask material, or combinations thereof. In FIG. 2A and FIG. 2B, patterned hard mask layer 60 includes a pattern formed by various openings, such as an opening 65A, an opening 65B, an opening 65C, an opening 65D, an opening 65E, and an opening 65F. Openings 65A-65F (also referred to as hard mask features) define one or more IC features to be formed on and/or in wafer 55. An end-to-end space E1 is defined between adjacent openings, such as between opening 65A and opening 65B, opening 65C and opening 65D, and opening 65E and opening 65F. End-to-end space E1 is greater than a defined end-to-end space for semiconductor device 50, such as an end-to-end space defined for IC features of a target wafer pattern (for example, provided by IC design specifications and/or an IC design layout). In some implementations, end-to-end space E1 is a minimum size achievable by the lithography process used to form patterned hard mask layer 60 (for example, when the lithography process is pushed to its highest resolution limits), which is larger than the defined (desired) end-to-end space. Openings 65A-65F also have horizontal dimensions, such as a length L1 that extends in a y-direction and a width W1 that extends in an x-direction, and vertical dimensions, such as a depth D1 that extends in a z-direction. Length L1 is defined between sidewalls 70 and sidewalls 72. Though the depicted embodiment depicts openings 65A-65F with same end-to-end spacing, widths, and lengths, the present disclosure contemplates embodiments having openings 65A-65F with varying end-to-end spacing, widths, and/or lengths. Furthermore, the present disclosure contemplates openings 65A-65F having different end-to-end spacing, widths, and/or lengths depending on technology nodes implemented for fabricating semiconductor device 50.

In FIG. 3A and FIG. 3B, a surface directional etching process (also referred to as a horizontal directional etching process) is performed to modify a horizontal profile of the hard mask features of patterned hard mask layer 60, such that end-to-end spacing is decreased between adjacent hard mask features. For example, the surface directional etching process increases a length and/or a width of openings 65A-65F. In the depicted embodiment, portions of patterned hard mask layer 60 defining sidewalls 70 and sidewalls 72 are laterally removed to increase a length of openings 65A-65F from length L1 to a length L2 (defined between sidewalls 70' and sidewalls 72'), while not (or only minimally) modifying the width and the depth of openings 65A-65F, such that openings 65A-65F maintain width W1 and depth D1. An end-to-end space E2, which is less than end-to-end space E1, is defined between adjacent openings.

In some implementations, end-to-end space E2 meets a defined end-to-end space for semiconductor device 50, such as the end-to-end space defined for IC features of the target wafer pattern. In some implementations, end-to-end space E2 is smaller than the minimum size achievable by the lithography process used to form patterned hard mask layer 60.

The surface directional etching process is a selective dry etching process that selectively etches patterned hard mask layer 60 relative to wafer 55. The selective dry etching process directs an etching species in a substantially horizontal direction relative to a horizontal surface 80 of wafer 55, thereby achieving horizontal etching of patterned hard mask layer 60. As used herein, substantially horizontal direction generally refers to when etching species are directed towards a horizontal surface of wafer 55 (here, surface 80) at an angle θ of about 0° to about 20° relative to a horizontal plane, such as an X-Y plane, substantially parallel to the horizontal surface. In some implementations, angle θ is less than or equal to about 10°. As depicted in FIG. 3A, etching species are further directed in an in-plane direction, which generally refers to directing etching species horizontally at any angle Φ relative to an axis in the horizontal plane, such as a Y-axis or an X-axis. Angle Φ is about 0° to about 360°, depending on desired horizontal etching. In the depicted embodiment, various surface directional etching parameters are tuned to cause etching species to flow in an in-plane direction along sidewalls of openings 65A-65F to increase a horizontal dimension of openings 65A-65F. For example, etching species are directed in a y-direction over surface 80 of wafer 55 (in other words, angle Φ is about 0° or about 180° relative to the Y-axis), such that the etching species remove portions of patterned hard mask layer 60 in the y-direction, while not (or only minimally) removing portions of patterned hard mask layer 60 in the x-direction and/or the z-direction. In such implementations, etching species are directed in an in-plane direction substantially perpendicular to sidewalls 70 and sidewalls 72 of openings 65A-65F. In some implementations, the surface directional etching process is a plasma etching process tuned to cause plasma to flow in an in-plane direction, such as in the y-direction, over wafer 55, such that profiles of openings 65A-65F are modified in the y-direction.

Various etching parameters can be tuned to generate etching species that travel in a horizontal direction, such as etchant composition, etching temperature, etching time, etching pressure, radio frequency (RF) bias voltage, RF bias power, etchant flow rate, wafer tilting, other suitable etching parameters, or combinations thereof. In some implementations, RF bias voltage is tuned to achieve an electric field that causes etching species to flow substantially horizontally along an in-plane direction (for example, in the y-direction) relative to surface 80 over wafer 55. For example, different RF bias voltages may be implemented to direct etching species horizontally in a y-direction where angle Φ is about 0° relative to the Y-axis and a y-direction where angle Φ is about 180° relative to the Y-axis. In such implementations, portions of sidewalls 70 and sidewalls 72 are horizontally etched in the y-direction. In some implementations, wafer 55 is secured to a wafer stage, and the wafer stage is tilted in a manner that allows etching species to flow horizontally along an in-plane direction relative to surface 80 over wafer 55. In some implementations, the wafer stage is tilted differently to allow etching species to flow horizontally along different in-plane directions (for example, a y-direction where angle Φ is about 0° relative to the Y-axis and a y-direction where angle Φ is about 180° relative to the Y-axis), thereby removing portions of sidewalls 70 and sidewalls 72. In some implementations, a first surface directional etching process is performed to remove portions of sidewalls 70, and a second surface directional etching process is performed to remove portions of sidewalls 72. Alternatively or additionally, to increase a width of openings 65A-65F, the surface directional etching process is tuned to cause etching species to flow in an x-direction relative to surface 80 over wafer 55 (in other words, angle Φ is about 90° or about 270° relative to the Y-axis), such that the etching species removes portions of patterned hard mask layer 60 in the x-direction, while not (or only minimally) removing portions of patterned hard mask layer 60 in the y-direction and/or the z-direction.

Figure 4A:
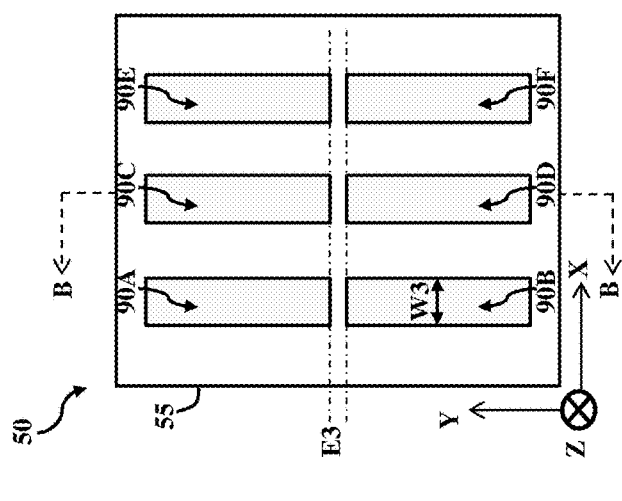
Figure 4B:
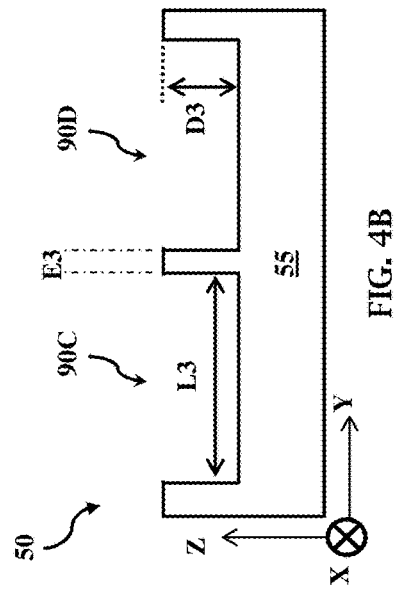

In FIG. 4A and FIG. 4B, a pattern defined by patterned hard mask layer 60 is transferred to wafer 55, such that IC features are formed on and/or in wafer 55. For example, a trench 90A, a trench 90B, a trench 90C, a trench 90D, a trench 90E, and a trench 90F is formed in wafer 55 (for example, in a substrate and/or a wafer material layer of wafer 55), which correspond respectively with opening 65A, opening 65B, opening 65C, opening 65D, opening 65E, and opening 65F. In some implementations, an etching process is performed that removes portions of wafer 55 to form trenches 90A-90F, where the etching process uses patterned hard mask layer 60 as an etch mask during the etching process. The etching process includes wet etching processes, dry etching processes, other suitable etching processes, or combinations thereof. Thereafter, patterned hard mask layer 60 is removed from wafer 55. An end-to-end space E3 is defined between adjacent trenches, such as between trench 90A and trench 90B, trench 90C and trench 90D, and trench 90E and trench 90F. In some implementations, end-to-end space E3 meets a defined end-to-end space for semiconductor device 50, such as the end-to-end space defined for IC features of the target wafer pattern. In some implementations, end-to-end space E3 is smaller than the minimum size achievable by the lithography process used to form patterned hard mask layer 60. Trenches 90A-90F also have horizontal dimensions, such as a length L3 that extends in a y-direction and a width W3 that extends in an x-direction, and vertical dimensions, such as a depth D3 that extends in a z-direction. In some implementations, length L3 and width W3 meet a length and width defined for trenches of a target wafer pattern. In some implementations, length L3 is approximately equal to length L2, and width W3 is approximately equal to width W2.

In some implementations, IC fabrication continues, where trenches 90A-90F are filled with a dielectric material, for example, to form isolation features, such as shallow trench isolation (STI) features. In some implementations, trenches 90A-90F are filled with a semiconductor material and/or a conductive material, for example, to form semi-conductive features and/or conductive features. In some implementations, the semi-conductive and/or conductive features can form interconnect features of a multi-layer interconnection (MLI) structure, such as conductive lines and/or conductive vias. Alternatively, in some implementations, instead of removing portions of wafer 55 as depicted, an implantation process is performed to form various doped regions/features in wafer 55 (for example, in a substrate and/or wafer material layer of wafer 55), where patterned hard mask layer 60 is used as an implantation mask during the implantation process. In such implementations, openings 65A-65F (hard mask features) define dimensions of doped regions formed in wafer 55. Alternatively, in some implementations, instead of removing portions of wafer 55 as depicted, a deposition process is performed that fills openings 65A-65F (hard mask features) in patterned hard mask layer 60 with a dielectric material, a semiconductor material, or a conductive material. In such implementations, removing patterned hard mask layer leaves a patterned material layer over wafer 55 that is patterned with a negative image of patterned hard mask layer 60. An after etch inspection can be performed to capture information, such as critical dimension uniformity, associated with IC features formed on and/or in wafer 55.

Turning to FIGS. 5A-7A and FIGS. 5B-7B, uncontrolled line edge roughness (LER) and/or line width roughness (LWR), which generally characterizes a deviation of an edge or width of an IC feature (such as a conductive line) from an ideal edge or ideal width, can have significant impacts on semiconductor devices (for example, transistors). Such impacts include poor parametric device performance and yield, for example, and variations in critical dimension (CD), which can cause variations in current ($I_{off}$, $I_{dsat}$). Surface directional etching can be implemented to improve LER and/or LWR, as described below. FIGS. 5A-7A and FIGS. 5B-7B are fragmentary diagrammatic views of a semiconductor device 100, in portion or entirety, at various fabrication stages (such as those associated with method 10) according to various aspects of the present disclosure. In particular, FIGS. 5A-7A are top views of semiconductor device 100, and FIGS. 5B-7B are diagrammatic cross-sectional views of semiconductor device 100 along line B-B in respective FIGS. 5A-7A. Semiconductor device 100 is similar in many respects to semiconductor device 50. Accordingly, similar features in FIGS. 5A-7A and FIGS. 5B-7B and FIGS. 2A-4A and FIGS. 2B-4B are identified by the same reference numerals for clarity and simplicity. FIGS. 5A-7A and FIGS. 5B-7B have been simplified for the sake of clarity to better understand the inventive concepts of the present disclosure. Additional features can be added in semiconductor device 100, and some of the features described below can be replaced, modified, or eliminated in other embodiments of semiconductor device 100.

Figure 5A:
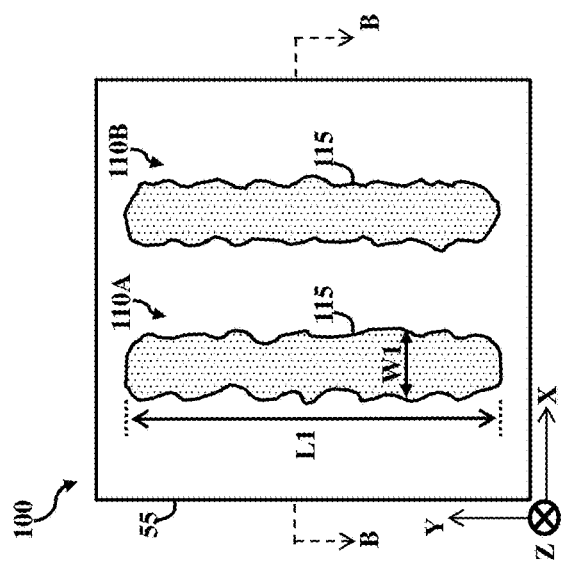
Figure 5B:
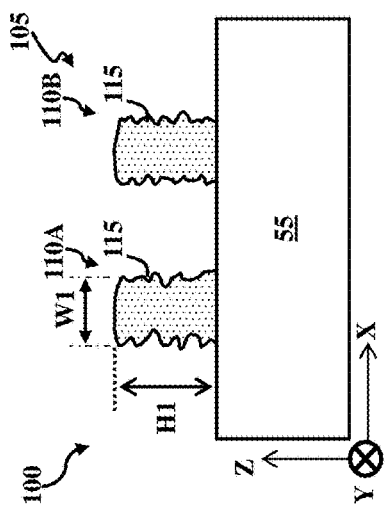

In FIG. 5A and FIG. 5B, semiconductor device 100 includes wafer 55. A patterned hard mask layer 105, similar to patterned hard mask layer 60, is formed over wafer 55 by any suitable process. For example, a lithography process is performed to form patterned hard mask layer 105, such as described above. In contrast to patterned hard mask layer 60, patterned hard mask layer 105 includes a pattern having various line structures, such as a line 110A and a line 110B. Line 110A and line 110B (also referred to as hard mask features) define one or more IC features to be formed on and/or in wafer 55. Line 110A and line 110B have horizontal dimensions, such as a length L1 that extends in a y-direction and a width W1 that extends in an x-direction, and vertical dimensions, such as a height H1 that extends in a z-direction. Line 110A and line 110B both exhibit line width roughness and/or line edge roughness (depicted as width W1 varying along length L1), which is defined by respective post-lithography LWR values and/or respective post-lithography LER values. In some implementations, the post-lithography LWR values and/or the post-lithography LER values are minimum LWR values and/or minimum LER values achievable by the lithography process (for example, when the lithography process is pushed to its highest resolution limits). In some implementations, the post-lithography LWR values reflect deviations of width W1 at various locations along length L1 from a defined width for lines in a target wafer pattern (for example, provided by IC design specifications and/or an IC design layout for semiconductor device 100). In some implementations, the post-lithography LER values reflect deviations of edges 115 at various locations along length L1 from a defined location for edges of lines of the target wafer pattern (for example, provided by the IC design specifications and/or the IC design layout).

Figure 6A:
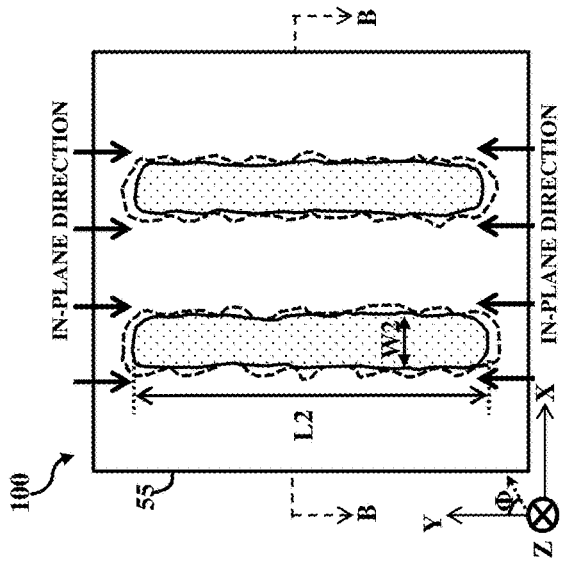
Figure 6B:
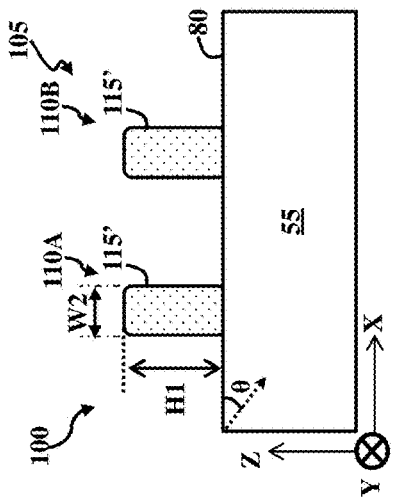

In FIG. 6A and FIG. 6B, a surface directional etching process is performed to modify a horizontal profile of the hard mask features of patterned hard mask layer 105, decreasing LWR and/or LER exhibited by the hard mask features. For example, the surface directional etching process smoothes edges 115 of line 110A and line 110B, thereby reducing the post-lithography LWR values and/or the post-lithography LER values of line 110A and line 110B. In the depicted embodiment, portions of line 110A and line 110B are removed to reshape edges 115, providing edges 115', such that line 110A and line 110B exhibit post-surface directional etching LWR values and/or post-surface directional etching LER values that are smaller than the post-lithography LWR values and/or the post-lithography LER values. In some implementations, post-surface directional etching LWR values and/or post-surface directional etching LER values are smaller than a minimum LWR and/or a minimum LER achievable by the lithography process used to form patterned hard mask layer 105. In some implementations, the surface directional etching process reduces a length and/or a width of line 110A and line 110B, such that line 110A and line 110B have a length L2 that is less than length L1 and a width W2 that is less than width W1. In such implementations, length L1 and width W1 are larger than a defined length and a defined width for lines of the target wafer pattern (for example, provided by the IC design specifications and/or the IC design layout for semiconductor device 100), such that length L2 and width W2 meet the defined length and the defined width after the surface directional etching process. Alternatively, in some implementations, the surface directional etching process reduces LWR and/or LER of line 110A and line 110B without (or minimally) modifying a length and/or width of line 110A and line 110B, such that length L2 is approximately equal to length L1 and width W2 is approximately equal to width W1.

The surface directional etching process is a selective dry etching process that selectively etches patterned hard mask layer 105 relative to wafer 55. In the depicted embodiment, the selective dry etching process directs an etching species in a substantially horizontal direction relative to surface 80 of wafer 55, thereby achieving horizontal etching of line 110A and line 110B. For example, etching species are directed towards surface 80 of wafer 55 at angle θ of about 0° to about 20° relative to the horizontal plane (here, the X-Y plane) substantially parallel to surface 80. In some implementations, angle θ is less than or equal to about 10°. As depicted in FIG. 6A, etching species are further directed in an in-plane direction, which generally refers to directing etching species horizontally at any angle Φ relative to an axis in the horizontal plane, such as a Y-axis or an X-axis. Angle Φ is about 0° to about 360°, depending on desired horizontal etching. In the depicted embodiment, various surface directional etching parameters are tuned to cause etching species to flow in an in-plane direction along edges of line 110A and line 110B to reduce LWR and/or LER. For example, etching species are directed in a y-direction over surface 80 of wafer 55 (in other words, angle Φ is about 0° or about 180° relative to the Y-axis), such that the etching species removes portions of line 110A and line 110B along edges 115 extending in the y-direction. In such implementations, etching species are directed in an in-plane direction that is substantially parallel to edges targeted for smoothing (to decrease LWR and/or LER). In some implementations, the etching species remove portions of line 110A and line 110B that protrude from edges 115 in an x-direction. In some implementations, the surface directional etching process is a plasma etching process tuned to cause plasma to flow in an in-plane direction, such as in the y-direction, over wafer 55, such that profiles of line 110A and line 110B are modified in the in-plane direction.

Various etching parameters can be tuned to generate etching species that travel in a horizontal direction, such as etchant composition, etching temperature, etching time, etching pressure, RF bias voltage, RF bias power, etchant flow rate, wafer tilting, other suitable etching parameters, or combinations thereof. In some implementations, different RF bias voltages are used for horizontally etching line 110A and line 110B from opposite ends. For example, different RF bias voltages may be implemented to direct etching species horizontally in a y-direction along line 110A and line 110B, where angle Φ of about 0° and angle Φ of about 180° relative to the Y-axis. In some implementations, wafer 55 is secured to a wafer stage, and the wafer stage is tilted differently for horizontally directing etching species to each end of line 110A and line 110B. For example, the wafer stage is tilted to direct etching species horizontally in the y-direction along one end of line 110A and line 110B, where angle Φ is about 0° relative to the Y-axis, and the wafer stage is tilted to direct species horizontally in the y-direction along another end of line 110A and line 110B, where angle Φ is about 180° relative to the Y-axis. In some implementations, separate surface directional etching processes are performed, such that etching species are horizontally directed to each end of line 110A and line 110B. Alternatively or additionally, the surface directional etching process is tuned to cause etching species to flow horizontally in an x-direction along line 110A and line 110B (for example, where angle Φ is about 90° or about 270° relative to the Y-axis), such that etching species are directed along edges of line 110A and line 110B extending in the x-direction.

In FIG. 7A and FIG. 7B, a pattern defined by patterned hard mask layer 105 is transferred to wafer 55, such that IC features are formed on and/or in wafer 55. For example, a line 120A and a line 120B are formed in a wafer material layer of wafer 55. Line 120A and line 120B correspond respectively with line 110A and line 110B. The wafer material layer can be a dielectric layer, a semiconductor layer, and/or a conductive layer of wafer 55. In the depicted embodiment, a selective etching process is performed that removes portions of wafer 55 to form line 120A and line 120B, where the etching process uses patterned hard mask layer 105 as an etch mask during the etching process. The etching process includes wet etching processes, dry etching processes, other suitable etching processes, or combinations thereof. By reducing LWR and/or LER exhibited by line 110A and line 110B of patterned hard mask layer 105, line 120A and line 120B exhibit reduced LWR and/or LER. In some implementations, line 120A and line 120B exhibit LWR values and/or LER values smaller than a minimum LWR and/or a minimum LER achievable by the lithography process used to form patterned hard mask layer 105. Line 120A and line 120B also have horizontal dimensions, such as a length L3 that extends in a y-direction and a width W3 that extends in an x-direction, and vertical dimensions, such as a height H3 that extends in a z-direction. In some implementations, length L3 and width W3 meet a length and width defined for trenches of a target wafer pattern. In some implementations, length L3 is approximately equal to length L2, and width W3 is approximately equal to width W2. Thereafter, patterned hard mask layer 105 is removed from wafer 55.

Turning to FIGS. 8A-10A and FIGS. 8B-10B, IC features often exhibit significant line-end rounding and/or line-end shortening as lithography processes reach resolution limits. Surface directional etching can be implemented to improve IC feature end profiles (such as line end profiles and/or trench end profiles), as described below. FIGS. 8A-10A and FIGS. 8B-10B are fragmentary diagrammatic views of a semiconductor device 150, in portion or entirety, at various fabrication stages (such as those associated with method 10) according to various aspects of the present disclosure. In particular, FIGS. 8A-10A are top views of semiconductor device 150, and FIGS. 8B-10B are diagrammatic cross-sectional views of semiconductor device 150 along line B-B in respective FIGS. 8A-10A. Semiconductor device 150 is similar in many respects to semiconductor device 50. Accordingly, similar features in FIGS. 8A-10A and FIGS. 8B-10B and FIGS. 2A-4A and FIGS. 2B-4B are identified by the same reference numerals for clarity and simplicity. FIGS. 8A-10A and FIGS. 8B-10B have been simplified for the sake of clarity to better understand the inventive concepts of the present disclosure. Additional features can be added in semiconductor device 150, and some of the features described below can be replaced, modified, or eliminated in other embodiments of semiconductor device 150.

In FIG. 8A and FIG. 8B, semiconductor device 150 includes wafer 55. A patterned hard mask layer 160, similar to patterned hard mask layer 60, is formed over wafer 55 by any suitable process. For example, a lithography process is performed to form patterned hard mask layer 160, such as described above. In contrast to patterned hard mask layer 60, patterned hard mask layer 160 includes a pattern formed by various openings, such as an opening 165A and an opening 165B. Opening 165A and opening 165B (also referred to as hard mask features) define one or more IC features to be formed on and/or in wafer 55. Lithography resolution limits cause a profile of opening 165A and opening 165B to vary from a desired IC profile 170, such as that defined by IC design specifications and/or an IC design layout for semiconductor device 150. For example, IC profile 170 can define a line feature having a length L and a width W, where line ends 172 have approximately 90° corners. Limits of the lithography process used to form patterned hard mask layer 160 cause line end rounding, as depicted, with opening 165A and opening 165B having rounded line ends 175A and rounded line ends 175B, respectively. Such line end rounding often results in line end shortening, particularly as line widths and/or line lengths reach minimum line widths and/or line widths achievable by the lithography process. In the depicted embodiment, opening 165A and opening 165B also exhibit line end shortening. For example, opening 165A and opening 165B have horizontal dimensions, such as a length L1 that extends in a y-direction and a width W1 that extends in an x-direction, that are less than horizontal dimensions defined by IC profile 170, such as length L and width W. In some implementations, length L1 and width W1 are a minimum length and a minimum width achievable by the lithography process.

In FIG. 9A and FIG. 9B, a surface directional etching process is performed to modify a horizontal profile of the hard mask features of patterned hard mask layer 160, reshaping line ends of the hard mask features. For example, the surface directional etching process modifies line ends 175A and line ends 175B, such that opening 165A and opening 165B have respective line ends 175A' and line ends 175B' exhibiting reduced line end rounding and/or line end shortening. In the depicted embodiment, line ends 175A' and line ends 175B' have substantially rectangular profiles, which more closely resemble line ends 172 defined by IC profile 170. The surface directional etching process also increases a length and/or a width of opening 165A and opening 165B. For example, portions of patterned hard mask layer 160 defining sidewalls of opening 165A and opening 165B are removed to increase length L1 to a length L2 and width W1 to a width W2. In some implementations, length L2 and width W2 meet a length and a width defined for lines of a target wafer pattern. For example, length L2 is approximately equal to length L, and width W2 is approximately equal to width W.

The surface directional etching process is a selective dry etching process that selectively etches patterned hard mask layer 160 relative to wafer 55. The selective dry etching process directs an etching species in a substantially horizontal direction relative to surface 80 of wafer 55, thereby achieving horizontal etching of opening 165A and opening 165B. For example, etching species are directed towards surface 80 of wafer 55 at angle θ of about 0° to about 20° relative to the horizontal plane (here, the X-Y plane) substantially parallel to surface 80. In some implementations, angle θ is less than or equal to about 10°. As depicted in FIG. 9A, etching species are further directed in an in-plane direction, which generally refers to directing etching species horizontally at any angle Φ relative to an axis in the horizontal plane, such as a Y-axis or an X-axis. Angle Φ is about 0° to about 360°, depending on desired horizontal etching. To achieve oblique etching of patterned hard mask layer 160, various surface directional etching parameters are tuned to cause etching species to flow in an in-plane direction oblique to end portions of opening 165A and opening 165B (such as line ends 175A and line ends 175B). In such implementations, angle Φ is any angle other than 0°, 90°, 180°, 270°, or 360°, depending on desired horizontal etching. For example, etching species are directed in oblique in-plane directions over surface 80 of wafer 55 (for example, angle Φ is about 45°, about 135°, about 225°, and/or about 315° relative to the Y-axis), such that the etching species removes portions of patterned hard mask layer 160 in the oblique in-plane direction, thereby modifying profiles of opening 165A and opening 165B in the oblique in-plane direction (for example, in the x-direction and the y-direction). In some implementations, the surface directional etching process is a plasma etching process tuned to cause plasma to flow in a substantially horizontal direction relative to surface 80 of wafer 55, while also flowing an in-plane direction oblique to end portions of opening 165A and opening 165B.

Various etching parameters can be tuned to generate etching species that travel in oblique horizontal directions, such as etchant composition, etching temperature, etching time, etching pressure, RF bias voltage, RF bias power, etchant flow rate, wafer tilting, other suitable etching parameters, or combinations thereof. In some implementations, different RF bias voltages are used to allow etching species to flow horizontally along different in-plane directions oblique to opening 165A and opening 165B (in particular, oblique to line ends 175A and line ends 175B). For example, different RF bias voltages may be implemented to direct etching species horizontally along line ends 175A and line ends 175B in an in-plane direction where angle Φ is about 45° relative to the Y-axis, an in-plane direction where angle Φ is about 135° relative to the Y-axis, an in-plane direction where angle Φ is about 225° relative to the Y-axis, and/or an in-plane direction where angle Φ is about 315° relative to the Y-axis. In some implementations, wafer 55 is secured to a wafer stage, and the wafer stage is tilted in a manner that allows etching species to flow horizontally along different in-plane directions (as defined by different angles Φ), thereby removing portions of patterned hard mask layer 160 in the x-direction and the y-direction. In some implementations, the wafer stage is tilted differently to direct etching species horizontally in various oblique in-plane directions. In some implementations, a surface directional etching process is performed for each obliquely horizontal etch necessary for modifying opening 165A and opening 165B to achieve desired profiles for line ends 175A' and line ends 175B'.

In FIG. 10A and FIG. 10B, a pattern defined by patterned hard mask layer 160 is transferred to wafer 55, such that IC features are formed on and/or in wafer 55. For example, a line 190A and a line 190B are formed over wafer 55, which correspond respectively with opening 165A and opening 165B. For example, a deposition process is performed that fills opening 165A and opening 165B in patterned hard mask layer 160 with a dielectric material, a semiconductor material, or a conductive material. In the depicted embodiment, opening 165A and opening 165B are filled with a conductive material, such that line 190A and line 190B are conductive lines. Line 190A and line 190B have horizontal dimensions, such as a length L3 that extends in a y-direction and a width W3 that extends in an x-direction, and vertical dimensions, such as a height H3 that extends in a z-direction. By implementing the surface directional etching process on patterned hard mask layer 160, line 190A and line 190B exhibit reduced line end rounding and/or line end shortening. For example, line 190A and line 190B have respective line ends 192 exhibiting substantially rectangular profiles, such that line 190A and line 190B more closely resemble line ends 172 defined by IC profile 170. In some implementations, length L3 and width W3 also meet a length and a width defined for lines of a target wafer pattern. For example, length L3 is approximately equal to length L, and width W3 is approximately equal to width W. Thereafter, patterned hard mask layer 160 is removed from wafer 55. In such implementations, removing patterned hard mask layer 160 leaves a patterned material layer over wafer 55 (here, including line 190A and line 190B) that is patterned with a negative image of patterned hard mask layer 160.

Alternatively, in some implementations, an implantation process is performed to form various doped regions/features in wafer 55 (for example, in a substrate and/or wafer material layer of wafer 55), where patterned hard mask layer 160 is used as an implantation mask during the implantation process. In such implementations, opening 165A and opening 165B define dimensions of doped regions formed in wafer 55, and doped regions formed in wafer 55 exhibit improved end profiles. Alternatively, in some implementations, an etching process is performed that removes portions of wafer 55 to form trenches, where the etching process uses patterned hard mask layer 160 as an etch mask during the etching process. In such implementations, opening 165A and opening 165B define dimensions of trenches formed in wafer 55, and trenches formed in wafer 55 exhibit improved trench end profiles. Thereafter, patterned hard mask layer 160 is removed from wafer 55. In some implementations, IC fabrication continues, where the trenches are filled with a dielectric material, for example, to form isolation features, such as shallow trench isolation (STI) features. In some implementations, the trenches are filled with a semiconductor material and/or a conductive material, for example, to form semi-conductive features and/or conductive features.

Turning to FIGS. 11A-14A and FIGS. 11B-14B, lithography process resolution limits often confine IC interconnection structures to using square via interconnects, since current lithography processes generate slot via interconnects that exhibit worse critical dimension uniformity (CDU) compared to square via interconnects. Surface directional etching can be implemented to realize slot via interconnects with improved CDU, as described below. FIGS. 11A-14A and FIGS. 11B-14B are fragmentary diagrammatic views of a semiconductor device 200, in portion or entirety, at various fabrication stages (such as those associated with method 10) according to various aspects of the present disclosure. In particular, FIGS. 11A-14A are top views of semiconductor device 200, and FIGS. 11B-14B are perspective views of semiconductor device 200. Semiconductor device 200 is similar in many respects to semiconductor device 50. Accordingly, similar features in FIGS. 11A-14A and FIGS. 11B-14B and FIGS. 2A-4A and FIGS. 2B-4B are identified by the same reference numerals for clarity and simplicity. FIGS. 11A-14A and FIGS. 11B-14B have been simplified for the sake of clarity to better understand the inventive concepts of the present disclosure. Additional features can be added in semiconductor device 200, and some of the features described below can be replaced, modified, or eliminated in other embodiments of semiconductor device 200.

Figure 11A:
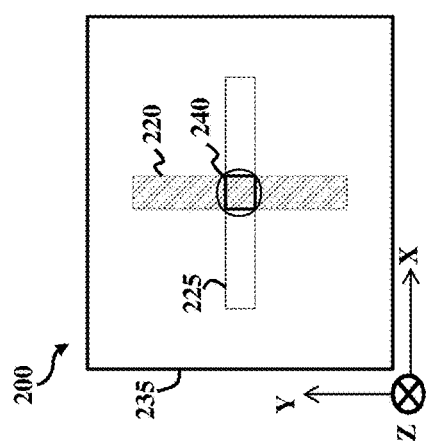
Figure 11B:
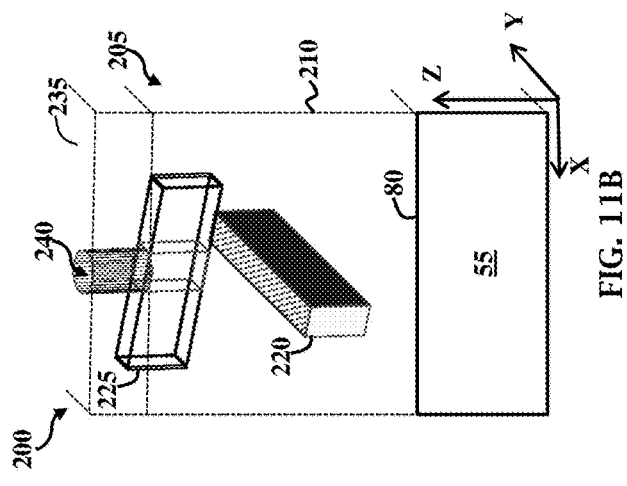

In FIG. 11A and FIG. 11B, semiconductor device 200 has undergone a portion of a dual damascene process for forming interconnects of a multi-layer interconnect (MLI) feature 205 over wafer 55, which electrically couples various components of semiconductor device 200, such that the various components are operable to function as specified by design requirements of semiconductor device 200. MLI 205 includes an interlayer (or inter-level) dielectric (ILD) layer 210 having various conductive features, such as a conductive line 220, disposed therein. The various conductive features are vertical interconnects, such as contacts and/or vias, and/or horizontal interconnects, such as conductive line 220. In some implementations, conductive line 220 represents a metal one (M1) layer of MLI 205. ILD layer 210 is formed over wafer 55 by a deposition process, such as CVD, physical vapor deposition (PVD), atomic layer deposition (ALD), high density plasma CVD (HDPCVD), metal organic CVD (MOCVD), remote plasma CVD (RPCVD), plasma enhanced CVD (PECVD), low-pressure CVD (LP-CVD), atomic layer CVD (ALCVD), atmospheric pressure CVD (APCVD), plating, other suitable methods, or combinations thereof. ILD layer 210 includes a dielectric material, such as silicon oxide, silicon nitride, silicon oxynitride, TEOS formed oxide, phosphosilicate glass (PSG), borophosphosilicate glass (BPSG), low-k dielectric material, other suitable dielectric material, or combinations thereof. Exemplary low-k dielectric materials include fluorinated silica glass (FSG), carbon doped silicon oxide, Black Diamond® (Applied Materials of Santa Clara, Calif.), Xerogel, Aerogel, amorphous fluorinated carbon, Parylene, BCB (bis-benzocyclobutenes), SiLK (Dow Chemical, Midland, Mich.), polyimide, other proper materials, or combinations thereof. In the depicted embodiment, ILD layer 210 is a low-k dielectric layer. Though not depicted, it is understood that ILD layer 210 can include a multilayer structure (which can include various dielectric materials, in some implementations), where various conductive features are formed therein.

The depicted dual damascene process has implemented a trench first, then via technique, where a trench lithography process has been performed to form a trench 225 in ILD layer 210 over conductive line 220 (such as the M1 layer). Trench 225 defines a horizontal interconnect to be formed for MLI 205, such as a metal two (M2) layer of MLI 205. The trench lithography process includes a trench lithography patterning process and a trench etching process. The trench lithography patterning process can include forming a resist layer over ILD layer 210 (for example, by spin coating), performing a pre-exposure baking process, performing an exposure process using a mask (including mask alignment), performing a post-exposure baking process, and performing a developing process. During the exposure process, the resist layer is exposed to radiation energy, where the mask blocks radiation from and/or transmits radiation to the resist layer depending on a final mask pattern of the mask (which corresponds with a target wafer pattern defined by an IC design layout), such that an image is projected onto the resist layer that corresponds with the final mask pattern. Since the resist layer is sensitive to radiation energy, exposed portions of the resist layer chemically change, such that exposed portions of the resist layer correspond with the image. Alternatively, the exposure process is assisted, implemented, or replaced by other methods, such as maskless lithography, electron-beam writing, or ion-beam writing. Exposed (or non-exposed) portions of the resist layer are dissolved during the developing process depending on characteristics of the resist layer and characteristics of a developing solution. After development, the patterned resist layer includes a resist pattern that corresponds with a pattern to be formed in ILD layer 210. The trench etching process can include transferring the resist pattern defined in the patterned resist layer to ILD layer 210. For example, a trench etching process is performed that removes portions of ILD layer 210 over conductive line 220, thereby forming trench 225, where the etching process uses the patterned resist layer as an etch mask during the etching process. The etching process includes wet etching processes, dry etching processes, or combinations thereof. Thereafter, the trench lithography process includes removing the patterned resist layer from the wafer, for example, by a resist stripping process.

The depicted dual damascene process continues with a via lithography process for forming a via opening, which defines a vertical interconnect to be formed for MLI 205, such as between a M1 layer (depicted as conductive line 220) and a M2 layer (to be formed in trench 225). The via opening lithography process includes a via lithography patterning process and a via etching process. In FIG. 11A and FIG. 11B, the via lithography patterning process is performed to form a patterned hard mask layer 235, similar to patterned hard mask layer 60, over MLI 205. The via lithography patterning process is similar in many respects to the trench lithography patterning process, or other lithography patterning processes described herein, such as those described with reference to patterned hard mask layer 60. In contrast to patterned hard mask layer 60, patterned hard mask layer 235 includes a pattern having an opening 240 (also referred to as a hard mask feature) that extends through patterned hard mask layer 235 and trench 225 to ILD layer 210 over conductive feature 220. Other than opening 240, the patterned hard mask layer 235 fills trench 225. Opening 240 defines a vertical interconnect (via) to be formed for MLI 205. In a horizontal plane (for example, an X-Y plane substantially parallel to horizontal surface 80 of wafer 55), opening 240 has a circular-shaped profile (contour), such that opening 240 has approximately equal horizontal dimensions. For example, a length of opening 240 extending in a y-direction is approximately equal to a width of opening 240 extending in an x-direction. In some implementations, the length and the width are a minimum length and a minimum width achievable by the lithography process. Accordingly, opening 240, as confined by trench 225, defines a square via opening.

Figure 12A:
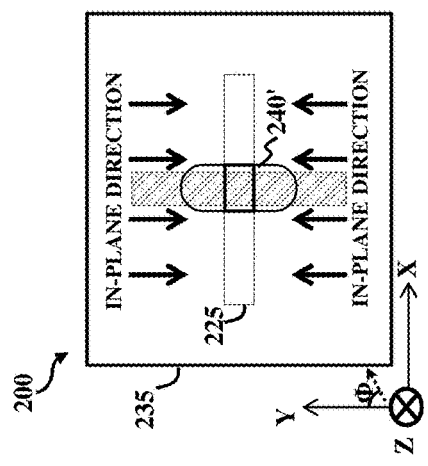
Figure 12B:
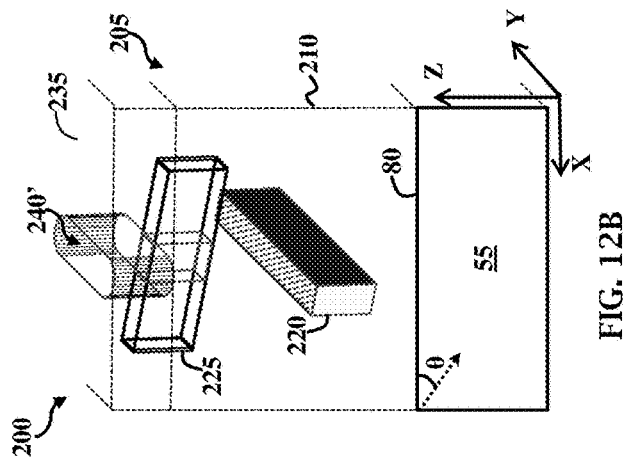

In FIG. 12A and FIG. 12B, a surface directional etching process is performed to modify a horizontal profile of the hard mask features of patterned hard mask layer 235, thereby reforming a shape of the hard mask features to accommodate slot (rectangular) vertical interconnects. For example, the surface directional etching process increases a length and/or a width of opening 240. In the depicted embodiment, portions of patterned hard mask layer 235 are removed to increase a length and/or a width of opening 240, thereby forming opening 240'. Opening 240' also extends through patterned hard mask layer 235 and trench 225 to ILD layer 210 over conductive feature 220. In the horizontal plane, opening 240' has an oval-shaped profile (contour), such that opening 240' has a length that is greater than the width. Accordingly, opening 240, as confined by trench 225, defines a slot (rectangular) via opening. The slot (rectangular) via opening has a length extending in the y-direction and a width extending in the x-direction, where the width is greater than the length.

The surface directional etching process is a selective dry etching process that selectively etches patterned hard mask layer 235 relative to ILD layer 210. The selective dry etching process directs an etching species in a substantially horizontal direction relative to surface 80 of wafer 55, thereby achieving horizontal etching of patterned hard mask layer 235. For example, etching species are directed towards surface 80 of wafer 55 at angle θ of about 0° to about 20° relative to the horizontal plane (here, the X-Y plane) substantially parallel to surface 80. In some implementations, angle θ is less than or equal to about 10°. As depicted in FIG. 12A, etching species are further directed in an in-plane direction, which generally refers to directing etching species horizontally at any angle Φ relative to an axis in the horizontal plane, such as a Y-axis or an X-axis. Angle Φ is about 0° to about 360°, depending on desired horizontal etching. In the depicted embodiment, various surface directional etching parameters are tuned to cause etching species to flow in an in-plane direction along sidewalls of opening 240 to increase a horizontal dimension of opening 240. For example, etching species are directed in an y-direction over surface 80 of wafer 55 (in other words, angle Φ is about 0° or about 180° relative to the Y-axis), such that the etching species removes portions of patterned hard mask layer 235 in the y-direction, while not (or only minimally) removing portions of patterned hard mask layer 235 in the x-direction and/or the z-direction. In some implementations, the surface directional etching process is a plasma etching process tuned to cause plasma to flow in an in-plane direction, such as in the y-direction, over wafer 55, such that a profile of opening 240 is modified in the y-direction.

Various etching parameters can be tuned to generate etching species that travel in a horizontal direction, such as etchant composition, etching temperature, etching time, etching pressure, RF bias voltage, RF bias power, etchant flow rate, wafer tilting, other suitable etching parameters, or combinations thereof. In some implementations, different RF bias voltages are used to allow etching species to flow horizontally along different in-plane directions. For example, different RF bias voltages may be implemented to direct etching species horizontally in a y-direction where angle Φ is about 0° relative to the Y-axis and a y-direction where angle Φ is about 180° relative to the Y-axis. In such implementations, portions of patterned hard mask layer 235 defining opposite ends of opening 240 are horizontally etched in the y-direction. In some implementations, wafer 55 is secured to a wafer stage, and the wafer stage is tilted differently to allow etching species to flow horizontally along different in-plane directions (for example, a y-direction where angle Φ is about 0° relative to the Y-axis and a y-direction where angle Φ is about 180° relative to the Y-axis), thereby removing portions of patterned hard mask layer 235 defining opposite ends of opening 240. In some implementations, a first surface directional etching process is performed to remove portions of patterned hard mask layer 235 defining one end of opening 240, and a second surface directional etching process is performed to remove portions of patterned hard mask layer 235 defining another end of opening 240. Alternatively or additionally, the surface directional etching process is tuned to cause etching species to flow in an x-direction relative to surface 80 over wafer 55 (in other words, angle Φ is about 90° or about 270° relative to the Y-axis), such that the etching species removes portions of patterned hard mask layer 235 in the x-direction.

Figure 13A:
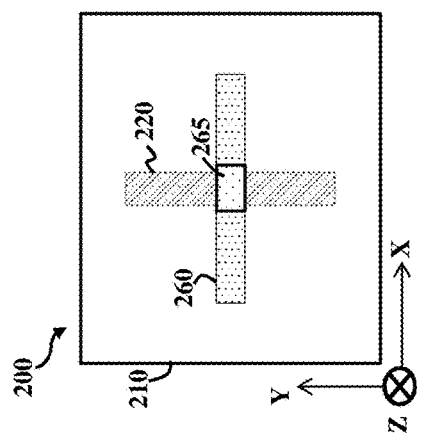
Figure 13B:
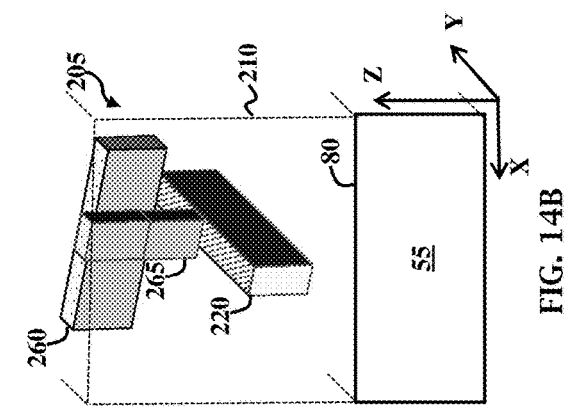

In FIG. 13A and FIG. 13B, a pattern defined by patterned hard mask layer 235, as confined by trench 225, is transferred to ILD layer 210, forming a via opening 250 in ILD layer 210 over conductive line 220. Via opening 250 extends through ILD layer 210 from trench 225 to conductive feature 220, thereby exposing a portion of conductive line 220. For example, the via etching process is performed to remove portions of ILD layer 210 exposed by opening 240', thereby forming via opening 250, where the etching process uses patterned hard mask layer 235 as an etch mask during the etching process. The etching process includes wet etching processes, dry etching processes, or combinations thereof. Via opening 250 is a slot (rectangular) via opening. For example, in a horizontal plane (for example, an X-Y plane substantially parallel to horizontal surface 80 of wafer 55), via opening 250 has a rectangular-shaped profile (contour), such that via opening 250 has a width extending in the x-direction and a length extending in the y-direction, where the width is greater than the length. Thereafter, the via lithography process can proceed with removing patterned hard mask layer 235 from ILD layer 210.

Figure 14A:
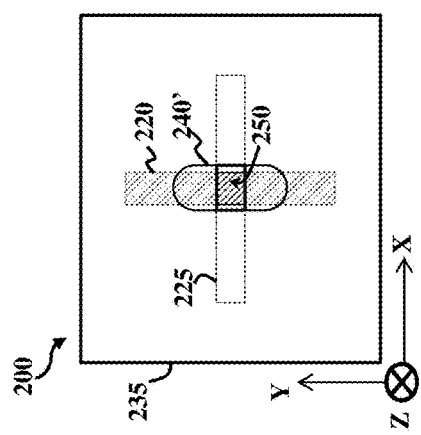
Figure 14B:
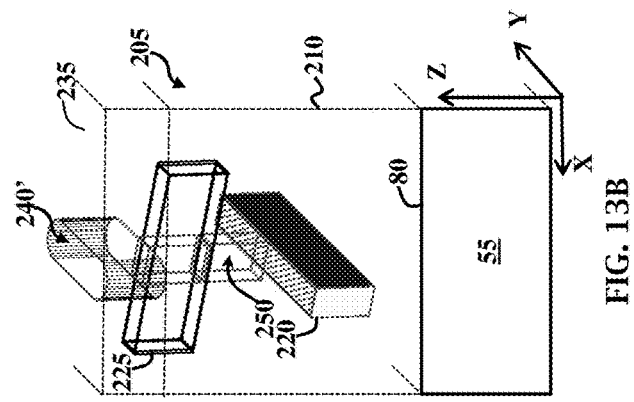

In FIG. 14A and FIG. 14B, a deposition process is performed to fill trench 225 and via opening 250, thereby forming conductive line 260 and conductive via 265. The deposition process can include CVD, PVD, ALD, HDP-CVD, MOCVD, RPCVD, PECVD, LPCVD, ALCVD, APCVD, plating, other suitable methods, or combinations thereof. Conductive line 260 defines a horizontal interconnect for MLI 205, such as the M2 layer. Conductive via 265 defines a vertical interconnect for MLI 205, such as a first via (V1) layer, which interconnects conductive line 260 (for example, the M2 layer) with conductive line 220 (for example, the M1 layer). By implementing the surface directional etching process during the via lithography patterning process, conductive via 265 is a slot (rectangular) via that exhibits improved CDU. The various conductive features (for example, conductive line 220, conductive line 260, and/or conductive via 265) include conductive materials, such as metal. Metals include aluminum, aluminum alloy (such as aluminum/silicon/copper alloy), copper, copper alloy, titanium, titanium nitride, tantalum, tantalum nitride, tungsten, polysilicon, metal silicide, other suitable metals, or combinations thereof. The metal silicide may include nickel silicide, cobalt silicide, tungsten silicide, tantalum silicide, titanium silicide, platinum silicide, erbium silicide, palladium silicide, or combinations thereof. In some implementations, conductive line 220, conductive line 260, and/or conductive via 265 is configured as aluminum interconnects. In some implementations, conductive line 220, conductive line 260, and/or conductive via 265 is configured as copper interconnects. MLI 205 is not limited by the number, material, size, and/or dimension of the conductive features (such as conductive line 220, conductive line 260, and conductive via 265) depicted, and thus, MLI 205 may include any number, material, size, and/or dimension of conductive features depending on design requirements of semiconductor 200.

Turning to FIGS. 15A-17A and FIGS. 15B-17B, though current lithography processes can generate oblique slot interconnects (generally referring to interconnects having horizontal dimensions that extend obliquely relative to axes defining a horizontal plane, such as an X-Y plane, that is substantially parallel with a horizontal surface of a semiconductor device, such as surface 80 of wafer 55), such interconnects exhibit worse critical dimension uniformity (CDU) compared to square contacts or slot contacts having horizontal dimensions that extend substantially parallel relative to the axes defining the horizontal plane. Lithography process resolution limits thus often confine IC interconnects (contacts) to square contacts or slot contacts. Surface directional etching can be implemented to realize oblique slot interconnects with improved CDU, as described below. FIGS. 15A-17A and FIGS. 15B-17B are fragmentary diagrammatic views of a semiconductor device 300, in portion or entirety, at various fabrication stages (such as those associated with method 10) according to various aspects of the present disclosure. In particular, 15A-17A are top views of semiconductor device 300, and FIGS. 15B-17B are diagrammatic cross-sectional views of semiconductor device 300 along line B-B in respective FIGS. 15A-17A. Semiconductor device 300 is similar in many respects to semiconductor device 50. Accordingly, similar features in 15A-17A and FIGS. 15B-17B and FIGS. 2A-4A and FIGS. 2B-4B are identified by the same reference numerals for clarity and simplicity. FIGS. 15A-17A and FIGS. 15B-17B have been simplified for the sake of clarity to better understand the inventive concepts of the present disclosure. Additional features can be added in semiconductor device 300, and some of the features described below can be replaced, modified, or eliminated in other embodiments of semiconductor device 300.

Figure 15A:
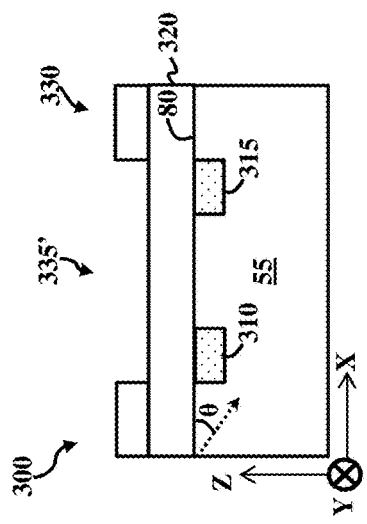
Figure 15B:
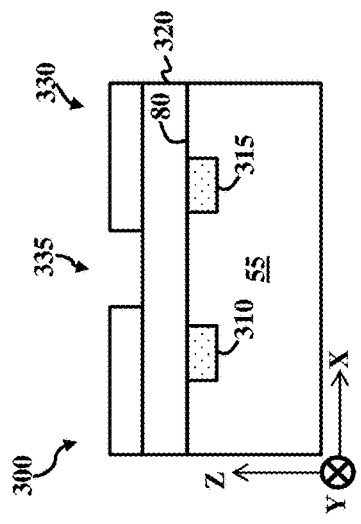

In FIG. 15A and FIG. 15B, semiconductor device 300 includes wafer 55 having an IC feature 310 and an IC feature 315. IC feature 310 and IC feature 315 represent doped regions/features, gate features, interconnect features, other suitable IC features of wafer 55, or combinations thereof. An ILD layer 320, similar to ILD layer 210, is disposed over wafer 55. A patterned hard mask layer 330, similar to patterned hard mask layer 60, is formed over wafer 55 by any suitable process. For example, a lithography process is performed to form patterned hard mask layer 330. In contrast to patterned hard mask layer 60, patterned hard mask layer 330 includes a pattern formed by an opening 335. Opening 335 (also referred to as a hard mask feature) defines an interconnect (contact) to be formed on and/or in wafer 55. In a horizontal plane (for example, an X-Y plane substantially parallel to horizontal surface 80 of wafer 55), opening 335 has a circular-shaped profile (contour), such that opening 335 has approximately equal horizontal dimensions. For example, a length of opening 335 extending in a y-direction is approximately equal to a width of opening 335 extending in an x-direction. In some implementations, the length and the width are a minimum length and a minimum width achievable by the lithography process. The horizontal dimensions (length and width) are substantially parallel with an X-axis and a Y-axis defining the X-Y plane.

Figure 16A:
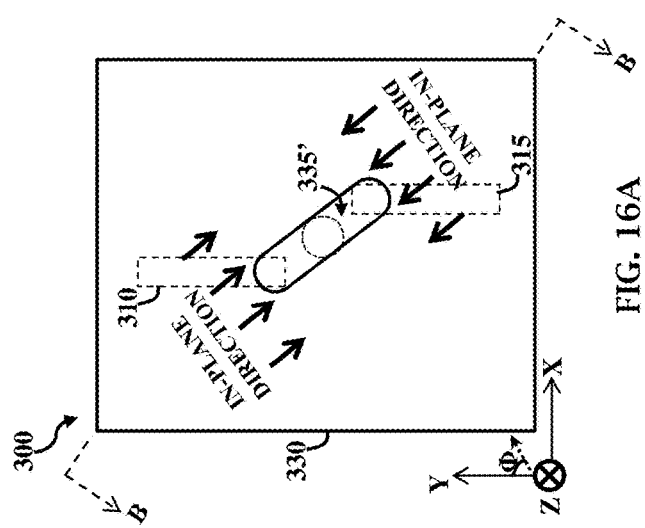
Figure 16B:
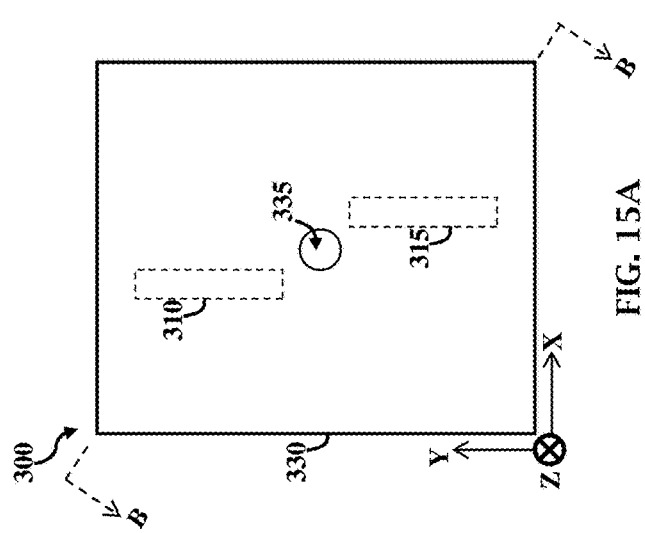

In FIG. 16A and FIG. 16B, a surface directional etching process is performed to modify a horizontal profile of the hard mask features of patterned hard mask layer 335, thereby reforming a shape of the hard mask features to exhibit an oblique profile (contour). For example, portions of patterned hard mask layer 330 are removed to extend opening 335 in an oblique direction relative to axes defining a horizontal plane that is substantially parallel to surface 80 of wafer 55, such as the Y-axis and/or the X-axis, thereby forming oblique opening 335'. Oblique opening 335' extends over a portion of IC feature 310 and a portion of IC feature 315. In the horizontal plane, oblique opening 335' has a length that extends in a y-direction at an oblique angle relative to the Y-axis (for example, about 315°), and a width that extends in the x-direction at an oblique angle relative to the X-axis (for example, about 45°). Oblique opening 335' has an oval-shaped profile, such that opening 335' has a length that is greater than the width.

The surface directional etching process is a selective dry etching process that selectively etches patterned hard mask layer 330 relative to ILD layer 320. The selective dry etching process directs an etching species in a substantially horizontal direction relative to surface 80 of wafer 55, thereby achieving horizontal etching of opening 335. For example, etching species are directed towards surface 80 of wafer 55 at angle θ of about 0° to about 20° relative to the horizontal plane (here, the X-Y plane) substantially parallel to surface 80. In some implementations, angle θ is less than or equal to about 10°. As depicted in FIG. 16A, etching species are further directed in an in-plane direction, which generally refers to directing etching species horizontally at any angle Φ relative to an axis in the horizontal plane, such as a Y-axis or an X-axis. Angle Φ is about 0° to about 360°, depending on desired horizontal etching. To achieve oblique etching of patterned hard mask layer 330, various surface directional etching parameters are tuned to cause etching species to flow in an in-plane direction oblique to opening 335. In such implementations, angle Φ is any angle other than 0°, 90°, 180°, 270°, or 360°, depending on desired horizontal etching. For example, etching species are directed in oblique in-plane directions over surface 80 of wafer 55 (for example, angle Φ is about 45° and about 315° relative to the Y-axis), such that the etching species removes portions of patterned hard mask layer 330 in the oblique in-plane direction, thereby modifying a profile of opening 335 in the oblique in-plane direction (for example, in the x-direction and the y-direction). In some implementations, the surface directional etching process is a plasma etching process tuned to cause plasma to flow in a substantially horizontal direction relative to surface 80 of wafer 55, while also flowing an in-plane direction oblique to opening 335.

Various etching parameters can be tuned to generate etching species that travel in oblique horizontal directions, such as etchant composition, etching temperature, etching time, etching pressure, RF bias voltage, RF bias power, etchant flow rate, wafer tilting, other suitable etching parameters, or combinations thereof. In some implementations, different RF bias voltages are used to allow etching species to flow horizontally along different in-plane directions oblique to opening 335. For example, different RF bias voltages may be implemented to direct etching species horizontally along opening 335 in an in-plane direction where angle Φ is about 45° relative to the Y-axis and an in-plane direction where angle Φ is about 315° relative to the Y-axis. In some implementations, wafer 55 is secured to a wafer stage, and the wafer stage is tilted in a manner that allows etching species to flow horizontally along different in-plane directions (as defined by different angles Φ), thereby removing portions of patterned hard mask layer 330 in the x-direction and the y-direction. In some implementations, the wafer stage is tilted differently to direct etching species horizontally in various oblique in-plane directions. In some implementations, a surface directional etching process is performed for each obliquely horizontal etch necessary for removing portions of patterned hard mask layer 330 to ensure that oblique opening 335' extends over a portion of IC feature 310 and a portion of IC feature 315.

Figure 17A:
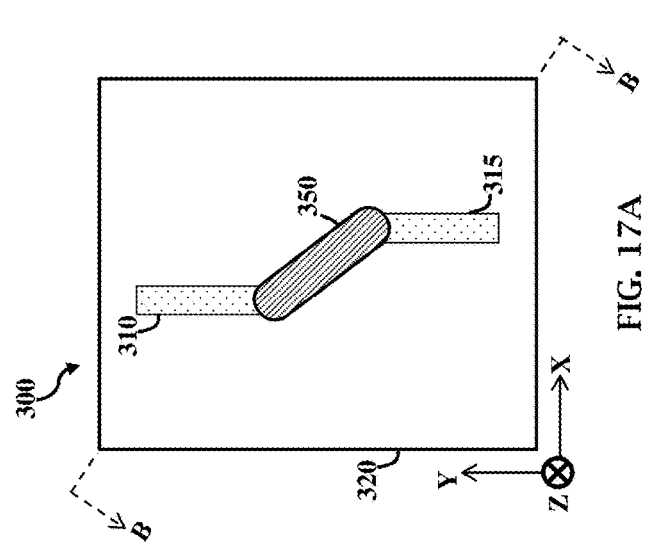
Figure 17B:
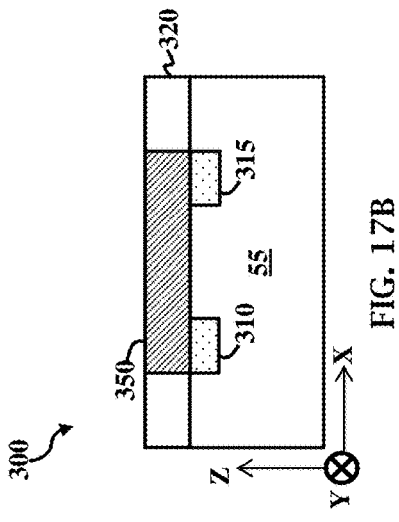

In FIG. 17A and FIG. 17B, a pattern defined by patterned hard mask layer 335 is transferred to wafer 55, such that IC features are formed on and/or in wafer 55. For example, an oblique interconnect (contact) 350 is formed over wafer 55, which corresponds respectively with oblique opening 335'. Oblique interconnect 350 interconnects IC feature 310 and IC feature 315. In the horizontal plane, oblique interconnect 350 has a length that extends in a y-direction at an oblique angle relative to the Y-axis (for example, about 315°), and a width that extends in the x-direction at an oblique angle relative to the X-axis (for example, about 45°). Oblique interconnect 350 has an oval-shaped profile, such that opening 335' has a length that is greater than the width. By implementing the surface directional etching process, oblique interconnect 350 exhibits improved CDU, substantially equivalent to CDU achieved for square interconnects and/or slot interconnects. In some implementations, forming oblique interconnect 350 includes performing an etching process that transfers oblique opening 335' to ILD layer 320 (using patterned hard mask layer 330 as a mask during the etching process), removing patterned hard mask layer 330 from ILD layer 320, and performing a deposition process to fill oblique opening 335' in ILD layer 320 with a conductive material. The etching process and/or the deposition process can be implemented in any suitable manner, as described herein.

Figure 18:
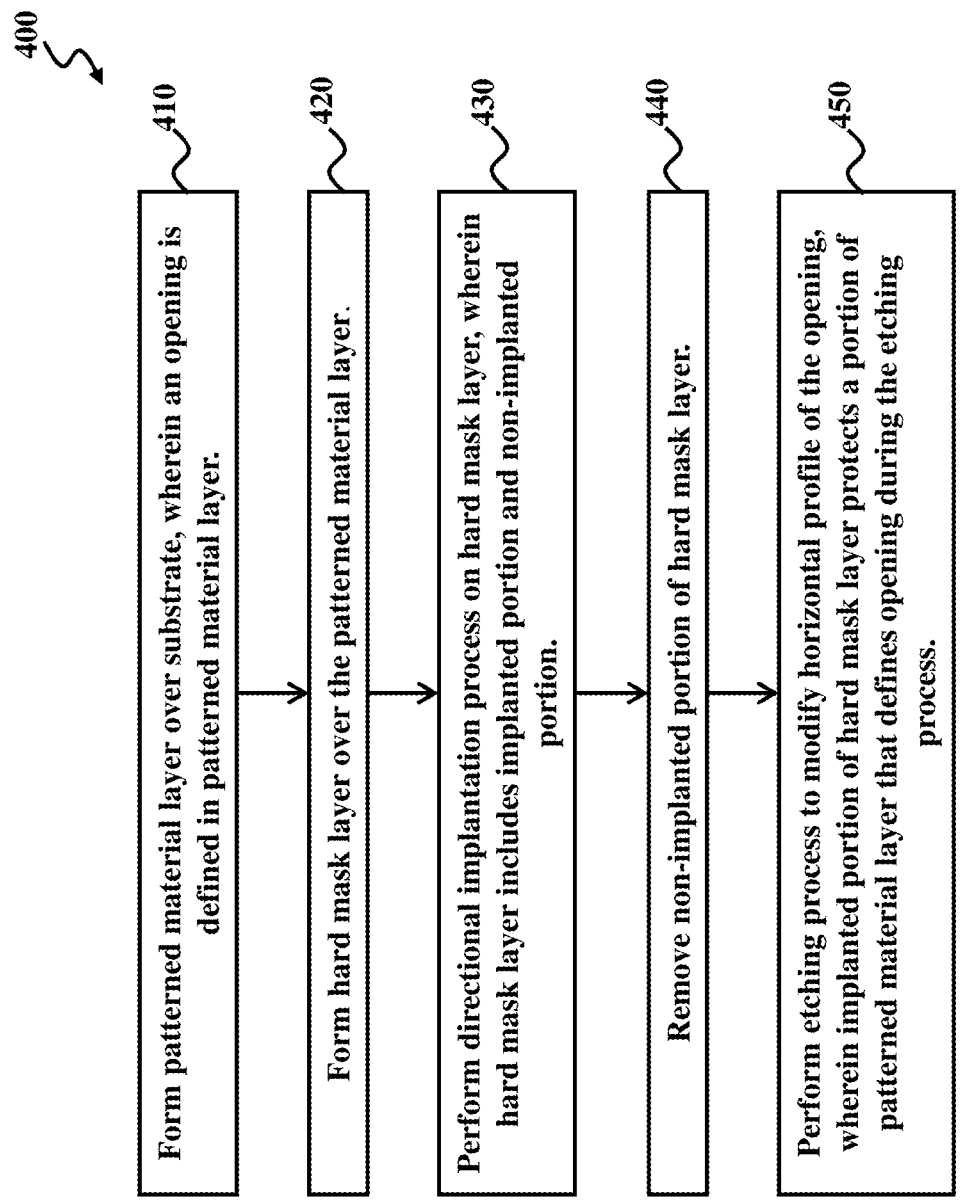
FIG. 18 is a flow chart of another directional patterning method, which can be implemented for fabricating semiconductor devices, according to various aspects of the present disclosure.

FIG. 18 is a flow chart of a directional patterning method 400, which can be implemented when fabricating semiconductor devices, according to various aspects of the present disclosure. Directional patterning method 400 provides enhanced etching selectivity compared to directional patterning methods that implement surface directional etching (such as the directional patterning methods described above). At block 410, a patterned material layer is formed over a substrate. The patterned material layer includes an opening defined therein. At block 420, a hard mask layer is formed over the patterned material layer. At block 430, a directional implantation process is performed on the hard mask layer, such that the hard mask layer includes an implanted portion and a non-implanted portion. At block 440, the non-implanted portions of the hard mask layer are removed. At block 450, an etching process is performed to modify a horizontal profile of the opening, wherein the implanted portion of the hard mask layer protects a portion of the patterned material layer that defines the opening during the etching process. In some implementations, the etching process is a surface directional etching process, such as those described above. Additional steps can be provided before, during, and after method 400, and some of the steps described can be moved, replaced, or eliminated for additional embodiments of method 400.

FIGS. 19A-24A, FIGS. 19B-24B, and FIGS. 19C-24C are fragmentary diagrammatic views of a semiconductor device 500, in portion or entirety, at various fabrication stages (such as those associated with method 400) according to various aspects of the present disclosure. In particular, FIGS. 19A-24A are top views of semiconductor device 500, FIGS. 19B-24B are diagrammatic cross-sectional views of semiconductor device 500 along line B-B in respective FIGS. 19A-24A, and FIGS. 19C-24C are diagrammatic cross-sectional views of semiconductor device 500 along line C-C in respective FIGS. 19A-24A. Semiconductor device 500 may be a portion of IC chip, a SoC, or portion thereof, that includes various passive and active microelectronic devices, such as resistors, capacitors, inductors, fuses, diodes, PFETs, NFETs, MOSFETs, CMOS transistors, high voltage transistors, high frequency transistors, other suitable components, or combinations thereof. FIGS. 19A-24A and FIGS. 19B-24B have been simplified for the sake of clarity to better understand the inventive concepts of the present disclosure. Additional features can be added in semiconductor device 500, and some of the features described below can be replaced, modified, or eliminated in other embodiments of semiconductor device 500.

In FIGS. 19A-19C, semiconductor device 500 includes a substrate (wafer) 510. In the depicted embodiment, substrate 510 is a silicon substrate. Alternatively or additionally, substrate 510 includes an elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; any other suitable material; or combinations thereof. Alternatively, substrate 510 is a semiconductor-on-insulator substrate, such as a silicon-on-insulator (SOI) substrate, a silicon germanium-on-insulator (SGOI) substrate, or a germanium-on-insulator (GOI) substrate. Semiconductor-on-insulator substrates can be fabricated using separation by implantation of oxygen (SIMOX), wafer bonding, and/or other suitable methods. Substrate 510 can include various doped regions (not shown) depending on design requirements of semiconductor device 500. In some implementations, substrate 510 includes p-type doped regions (for example, p-type wells) doped with p-type dopants, such as boron (for example, $BF_2$), indium, other p-type dopant, or combinations thereof. In some implementations, substrate 510 includes n-type doped regions (for example, n-type wells) doped with n-type dopants, such as phosphorus, arsenic, other n-type dopant, or combinations thereof. In some implementations, substrate 510 includes doped regions formed with combinations of p-type dopants and n-type dopants. The various doped regions can be formed directly on and/or in substrate 510, for example, providing a p-well structure, an n-well structure, a dual-well structure, a raised structure, or combinations thereof. Doping may be implemented using a process such as ion implantation or diffusion in various steps and techniques.

A patterned material layer 520 is formed over substrate 510 by any suitable process. Patterned material layer 520 includes a dielectric material, a semiconductor material, a conductive material, or combinations thereof. In FIG. 19A and FIG. 19B, patterned material layer 520 includes various trenches (openings), such as trenches 525. Trenches 525 have horizontal dimensions, such as a length L1 that extends in a y-direction and a width W1 that extends in an x-direction, and vertical dimensions, such as a depth D1 that extends in a z-direction. A horizontal contour (profile) of trenches 525 is defined by sidewalls 530, sidewalls 532, sidewalls 534, and sidewalls 536. For example, length L1 is defined between sidewalls 530 and sidewalls 532 (where sidewalls 530 and sidewalls 532 extend along the x-direction), and width W1 is defined between sidewalls 534 and sidewalls 536 (where sidewalls 534 and sidewalls 536 extend along the y-direction). Sidewalls 534 and sidewalls 536 define ends of trenches 525, in the depicted embodiment, generally rounded ends of trenches 525. Bottoms 538 of trenches 525 are defined by a surface 539 of substrate 510. Though the depicted embodiment depicts trenches 525 with same widths, lengths, and depths, the present disclosure contemplates embodiments having trenches 525 with varying widths, lengths, and depths.

In some implementations, forming patterned material layer 520 includes performing a deposition process to form a material layer over substrate 510 and performing a lithography process to form a pattern in the material layer. The deposition process includes chemical vapor deposition (CVD), physical vapor deposition (PVD), atomic layer deposition (ALD), high density plasma CVD (HDPCVD), metal organic CVD (MOCVD), remote plasma CVD (RP-CVD), plasma enhanced CVD (PECVD), low-pressure CVD (LPCVD), atomic layer CVD (ALCVD), atmospheric pressure CVD (APCVD), plating, other suitable methods, or combinations thereof. The lithography process can include forming a resist layer over the material layer (for example, by spin coating), performing a pre-exposure baking process, performing an exposure process using a mask (including mask alignment), performing a post-exposure baking process, and performing a developing process. During the exposure process, the resist layer is exposed to radiation energy (such as ultraviolet (UV) light, deep UV (DUV) light, or extreme UV (EUV) light), where the mask blocks radiation from and/or transmits radiation to the resist layer depending on a final mask pattern of the mask (which corresponds with a target wafer pattern defined by an IC design layout), such that an image is projected onto the resist layer that corresponds with the final mask pattern. Since the resist layer is sensitive to radiation energy, exposed portions of the resist layer chemically change, such that exposed portions of the resist layer correspond with the image. Alternatively, the exposure process is assisted, implemented, or replaced by other methods, such as maskless lithography, electron-beam writing, or ion-beam writing. Exposed (or non-exposed) portions of the resist layer are dissolved during the developing process depending on characteristics of the resist layer and characteristics of a developing solution. After development, the patterned resist layer includes a resist pattern that corresponds with a pattern to be formed in the material layer. The lithography process can further include transferring the resist pattern defined in the patterned resist layer to the material layer, resulting in patterned material layer 520. For example, an etching process is performed that removes portions of the material layer, where the etching process uses the patterned resist layer as an etch mask during the etching process. The etching process includes wet etching processes, dry etching processes, or combinations thereof. Thereafter, the lithography process includes removing the patterned resist layer from the wafer, for example, by a resist stripping process.

In FIG. 20A-20C, a hard mask layer 540 is formed over patterned material layer 520. For example, hard mask layer 540 is deposited over patterned material layer 520 by a suitable deposition process, such as a CVD process. Hard mask layer 540 conforms to patterned material layer 520, such that hard mask layer 540 conforms to sidewalls 530, sidewalls 532, sidewalls 534, sidewalls 536, and bottoms 538 of trenches 525. Hard mask layer 540 includes a material that can be reformed (modified or transformed) by an implantation process, such as an ion implantation process. For example, hard mask layer 540 includes silicon, silicon oxide, other material that can be reformed by an implantation process, or combinations thereof. In some implementations, hard mask layer 540 is a silicon layer. In some implementations, hard mask layer 540 is a silicon oxide (SiO) layer. Any suitable deposition process is implemented for forming hard mask layer 240, including CVD, PVD, ALD, other suitable deposition process, or combinations thereof.

In FIG. 21A-21C, a directional implantation process 550 is performed to transform (modify or reform) portions of hard mask layer 540, thereby forming implanted hard mask layer 540A. In some implementations, directional implantation process 550 is an ion implantation process that introduces dopant impurities into hard mask layer 540. Dopants include arsenic (As), phosphorous (P), antimony (Sb), nitrogen (N), boron (B), indium (In), other suitable dopant impurities, or combinations thereof. Directional implantation process 550 modifies etching characteristics of hard mask layer 540, such that implanted hard mask layer 540A has different etching characteristics than hard mask layer 540. For example, directional implantation process 550 modifies an etch resistance of portions of hard mask layer 540. In some implementations, implanted hard mask layer 540A has increased etch resistance to subsequent etching processes relative to hard mask layer 540. For example, where hard mask layer 540 includes silicon, directional implantation process 550 implants boron (B) into portions of hard mask layer 540, such that implanted hard mask layer 540A has greater etch resistance to subsequent etching processes relative to hard mask layer 540. In such implementations, implanted hard mask layer 540A includes silicon and boron. For example, implanted hard mask layer 540A is a silicon boron (SiB) layer. In some implementations, implanted hard mask layer 540A has decreased etch resistance to subsequent etching processes relative to hard mask layer 540. For example, where hard mask layer 540 includes silicon dioxide, directional implantation process 550 implants nitrogen (N) into portions of hard mask layer 540, such that implanted hard mask layer 540A has less etch resistance to subsequent etching processes relative to hard mask layer 540. In such implementations, implanted hard mask layer 540A includes silicon, oxygen, and nitrogen. For example, implanted hard mask layer 540A is a SiONx layer.

Directional implantation process 550 is performed at a tilt angle α relative to a perpendicular axis (such as a Z-axis) to a horizontal plane, such as an X-Y plane, that is substantially parallel to a horizontal surface of semiconductor device 500, such as surface 539 of substrate 510. As depicted in FIG. 21A, doping species are further directed in an in-plane direction, which generally refers to directing doping species at any angle ρ relative to an axis in the horizontal plane, such as a Y-axis or an X-axis. Tilt angle α and angle ρ are chosen to form sidewall masks 555 (from implanted hard mask layer 540A) that protect sidewalls of trenches 525 during subsequent etching processes, facilitating precisely controlled directional modification of a horizontal profile of trenches 525. In the depicted embodiment, tilt angle α and angle ρ are chosen to form sidewall masks 555 along sidewalls 534 and sidewalls 536, such that sidewalls 534 and sidewalls 536 are protected during subsequent etching processes. For example, sidewall masks 555 facilitate precisely controlled directional modification of a length of trenches 525, as described further below. In the depicted embodiment, various directional implantation parameters are tuned to cause doping species to flow in an in-plane direction along sidewalls 534 and sidewalls 536 of trenches 525. For example, doping species are directed in an x-direction over substrate 510 (in other words, angle ρ is about 90° or about 270° relative to the Y-axis), such that the doping species implanting portions of hard mask layer 540 covering sidewalls of trenches extending substantially in the y-direction (here, sidewalls 534 and sidewalls 536), while not (or only minimally) implanting portions of hard mask layer 540 covering sidewalls of trenches extending substantially in the x-direction (here, sidewalls 530 and sidewalls 532). In such implementations, doping species are directed in an in-plane direction substantially perpendicular to sidewalls 532 and sidewalls 534.

In FIGS. 22A-22C, a selective etching process is performed to remove hard mask layer 540. For example, an etching process removes hard mask layer 540, exposing sidewalls of trenches 525, such as sidewalls 530 and sidewalls 532. The etching process is a dry etching process, a wet etching process, or combinations thereof. In some implementations, due to a high etch rate of hard mask layer 540 relative to implanted hard mask layer 540A, the etching process can remove hard mask layer 540 while eliminating or minimizing any removal of implanted hard mask layer 540A, such that sidewall masks 550 remain along sidewalls 534 and sidewalls 536. Various etching parameters can be tuned to selectively etch hard mask layer 540, such as etchant composition, etching temperature, etching solution concentration, etching time, etching pressure, source power, radio frequency (RF) bias voltage, RF bias power, etchant flow rate, other suitable etching parameters, or combinations thereof. In some implementations, hard mask layer 540 may be etched using etch reactants having a high etch selectivity with respect to hard mask layer 540. For example, in implementations where hard mask layer 540 includes silicon and implanted hard mask layer 540A includes silicon and boron, a dry etching process can selectively etch hard mask layer 540 using an etching gas mixture that includes ammonia ($NH_3$). Alternatively, the selective etching process removes implanted hard mask layer 540A. In some implementations, implanted hard mask layer 540A may be etched using etch reactants having a high etch selectivity with respect to implanted hard mask layer 540A. For example, in implementations where hard mask layer 540 includes silicon and oxygen, and implanted hard mask layer 540A includes silicon, oxygen, and nitrogen, a wet etching process can selectively etch implanted hard mask layer 540A utilizing an etching solution that includes phosphoric acid ($H_3PO_4$). In such implementations, remaining hard mask layer 540 would form sidewall masks on sidewalls 530 and sidewalls 532.

In FIGS. 23A-23C, a selective etching process is performed to modify a horizontal profile of trenches 525. For example, the selective etching process increases a length and/or a width of trenches 525. In the depicted embodiment, portions of patterned material layer 520 defining sidewalls 530 and sidewalls 532 are removed to increase a length of trenches from length L1 to a length L2 (defined between sidewalls 530' and sidewalls 532'), while not (or only minimally) modifying the width and the depth of trenches 525, such that trenches 525 maintain width W1 and depth D1. Sidewall masks 555 (formed by implanted hard mask layer 540A) protect sidewalls 534 and sidewalls 536 during the selective etching process, ensuring that the horizontal profile of trenches 525 is not modified in the x-direction and facilitating controllable horizontal etching. The etching process is a dry etching process, a wet etching process, or combinations thereof. In some implementations, due to a high etch rate of patterned material layer 520 relative to implanted hard mask layer 540A, the etching process can remove patterned material layer 520 while eliminating or minimizing any removal of implanted hard mask layer 540A, such that sidewall masks 550 protect sidewalls 534 and sidewalls 536 during the etching process. Various etching parameters can be tuned to selectively etch patterned material layer 520, such as etchant composition, etching temperature, etching solution concentration, etching time, etching pressure, source power, RF bias voltage, RF bias power, etchant flow rate, other suitable etching parameters, or combinations thereof. In some implementations, patterned material layer 520 may be etched using etch reactants having a high etch selectivity with respect to patterned material layer 520. In some implementations, the selective etching process is a surface directional etching process, such as those described herein. Thereafter, implanted hard mask layer 540 is removed from patterned material layer 520 by a suitable process, as depicted in FIGS. 24A-24C.

The present disclosure provides various directional patterning methods. In some implementations, directional patterning methods described herein implement a surface directional etching process to improve horizontally-defined characteristics of hard mask features achieved by lithography processes, such that IC features using such hard mask features exhibit improved horizontally-defined characteristics. Horizontally-defined characteristic can include a length, a width, a line edge roughness, a line width roughness, a line end profile, other horizontally-defined characteristics, or combinations thereof.

An exemplary directional patterning method includes performing a lithography process to form a pattered hard mask layer over a wafer, wherein the patterned hard mask layer includes a hard mask feature having an associated horizontally-defined characteristic; tuning an etching process to direct etching species in a substantially horizontal direction relative to a horizontal surface of the wafer, such that the etching process horizontally removes portions of the patterned hard mask layer, thereby modifying the horizontally-defined characteristic of the hard mask feature; and forming an integrated circuit feature that corresponds with the hard mask feature having the modified horizontally-defined characteristic.

In some implementations, the horizontally-defined characteristic is a minimum characteristic achievable by the lithography process, and the modified horizontally-defined characteristic is smaller than the minimum characteristic achievable by the lithography process. In some implementations, the horizontally-defined characteristic is a line width roughness associated with the hard mask feature, an end-to-end spacing associated with the hard mask feature, or a line end profile associated with the hard mask feature. In some implementations, modifying the horizontally-defined characteristic of the hard mask feature includes forming an oblique opening. In some implementations, modifying the horizontally-defined characteristic of the hard mask feature includes increasing a length or a width of the hard mask feature.

Another exemplary directional patterning method includes forming a patterned hard mask layer over a wafer, wherein the patterned hard mask layer includes a hard mask feature; and performing a surface directional etching process to modify a horizontal profile of the hard mask feature, wherein the surface directional etching process directs etching species in a substantially horizontal direction relative to a horizontal surface of the wafer. The method can further include forming an integrated circuit feature that corresponds with the hard mask feature. In some implementations, the surface directional etching process directs the etching species towards a horizontal surface of the wafer at an angle θ that is less than about 10° relative to a horizontal plane that is substantially parallel to the horizontal surface.

In some implementations, the surface directional etching process further directs the etching species in an in-plane direction. In some implementations, the hard mask feature is an opening, and the surface directional etching process is implemented with the in-plane direction along sidewalls of the opening to increase a horizontal dimension of the opening. In some implementations, the hard mask feature is an opening and an end-to-end space is defined between the opening and an adjacent opening, and the surface directional etching process is implemented with the in-plane direction along sidewalls of the opening and sidewalls of the adjacent opening to decrease the end-to-end space. In some implementations, the hard mask feature is a line having a line width roughness, and the surface directional etching process is implemented with the in-plane direction along edges of the line to reduce the line width roughness. In some implementations, the hard mask feature is an opening having an end portion, and the surface directional etching process is implemented with the in-plane direction oblique to the end portion to reshape the end portion. In some implementations, the hard mask feature is an opening, and the surface directional etching process is implemented with the in-plane direction oblique to portions of the opening, thereby transforming the opening into an oblique opening. In some implementations, the hard mask feature is a circular-shaped via opening used to define a square-shaped via, and further the surface directional etching process is implemented with the in-plane direction along sidewalls of the circular-shaped via opening, thereby transforming the circular-shaped opening into an oval-shaped opening used to define a slot-shaped via.

Yet another exemplary directional patterning method includes forming a patterned material layer over a substrate, wherein an opening is defined in the patterned material layer; forming a hard mask layer over the patterned material layer; performing a directional implantation process on the hard mask layer, wherein the hard mask layer includes an implanted portion and a non-implanted portion; removing the non-implanted portion of the hard mask layer; and performing an etching process to modify a horizontal profile of the opening, wherein the implanted portion of the hard mask layer protects a portion of the patterned material layer that defines the opening during the etching process. Alternatively, in some implementations, the method includes removing the implanted portion of the hard mask layer, where the non-implanted portion of the hard mask layer protects the portion of the patterned material layer that defines the opening during the etching process. In some implementations, the implanted portion or the non-implanted portion of the hard mask layer forms a sidewall mask along a sidewall of the opening. In some implementations, the directional implantation process includes modifying an etching characteristic of the hard mask layer, such that the implanted portion has a different etching resistance than the non-implanted portion. In some implementations, the etching process is a surface directional etching process that directs etching species in a substantially horizontal direction relative to a horizontal surface of the substrate. In some implementations, modifying the horizontal profile of the opening include increasing a length or a width of the opening.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a patterned hard mask layer over a wafer, wherein the patterned hard mask layer includes a hard mask feature; and
    performing a surface directional etching process to modify a horizontal profile of the hard mask feature, wherein:
        the surface directional etching process directs etching species in a substantially horizontal direction relative to a horizontal surface of the wafer, and
        the surface directional etching process does not etch in a vertical direction.

2. The method of claim 1, further comprising forming an integrated circuit feature that corresponds with the hard mask feature.

3. The method of claim 1, wherein the surface directional etching process directs the etching species towards a horizontal surface of the wafer at an angle θ that is less than about 10° relative to a horizontal plane that is substantially parallel to the horizontal surface.

4. The method of claim 1, wherein the surface directional etching process further directs the etching species in an in-plane direction.

5. The method of claim 4, wherein the hard mask feature is an opening, and further wherein the surface directional etching process is implemented with the in-plane direction along sidewalls of the opening to increase a horizontal dimension of the opening.

6. The method of claim 4, wherein the hard mask feature is an opening and an end-to-end space is defined between the opening and an adjacent opening, wherein the surface directional etching process is implemented with the in-plane direction along sidewalls of the opening and sidewalls of the adjacent opening to decrease the end-to-end space.

7. The method of claim 4, wherein the hard mask feature is a line having a line width roughness, and further wherein the surface directional etching process is implemented with the in-plane direction along edges of the line to reduce the line width roughness.

8. The method of claim 4, wherein the hard mask feature is an opening having an end portion, and further wherein the surface directional etching process is implemented with the in-plane direction oblique to the end portion to reshape the end portion.

9. A method comprising:
    forming a patterned hard mask layer over a wafer, wherein the patterned hard mask layer includes a hard mask feature; and performing a surface directional etching process to modify a horizontal profile of the hard mask feature, wherein:
  the surface directional etching process directs etching species in an in-plane direction and a substantially horizontal direction relative to a horizontal surface of the wafer,
  the hard mask feature is an opening, and
  the surface directional etching process is implemented with the in-plane direction oblique to portions of the opening, thereby transforming the opening into an oblique opening.

10. A method comprising:
forming a patterned hard mask layer over a wafer, wherein the patterned hard mask layer includes a hard mask feature; and
performing a surface directional etching process to modify a horizontal profile of the hard mask feature, wherein:
  the surface directional etching process directs etching species in in an in-plane direction and a substantially horizontal direction relative to a horizontal surface of the wafer,
  the hard mask feature is a circular-shaped via opening used to define a square-shaped via, and
  the surface directional etching process is implemented with the in-plane direction along sidewalls of the circular-shaped via opening, thereby transforming the circular-shaped opening into an oval-shaped opening used to define a slot-shaped via.

11. A method comprising:
performing a lithography process to form a patterned hard mask layer over a wafer, wherein the patterned hard mask layer includes a hard mask feature having an associated horizontally-defined characteristic;
tuning an etching process to direct etching species in a substantially horizontal direction relative to a horizontal surface of the wafer, such that the etching process horizontally removes portions of the patterned hard mask layer, thereby modifying the horizontally-defined characteristic of the hard mask feature; and
forming an integrated circuit (IC) feature that corresponds with the hard mask feature having the modified horizontally-defined characteristic, wherein the horizontally-defined characteristic is a minimum characteristic achievable by the lithography process, and the modified horizontally-defined characteristic is smaller than the minimum characteristic achievable by the lithography process.

12. The method of claim 11, wherein the horizontally-defined characteristic is a line width roughness associated with the hard mask feature, an end-to-end spacing associated with the hard mask feature, or a line end profile associated with the hard mask feature.

13. The method of claim 11, wherein modifying the horizontally-defined characteristic of the hard mask feature includes forming an oblique opening.

14. The method of claim 11, wherein modifying the horizontally-defined characteristic of the hard mask feature includes increasing a length or a width of the hard mask feature.

15. A method comprising:
forming a patterned material layer over a substrate, wherein an opening is defined in the patterned material layer;
forming a hard mask layer over the patterned material layer;
performing a surface directional implantation process on the hard mask layer, wherein the hard mask layer includes an implanted portion and a non-implanted portion;
removing the non-implanted portion of the hard mask layer; and
performing an etching process to modify a horizontal profile of the opening, wherein the implanted portion of the hard mask layer protects a portion of the patterned material layer that defines the opening during the etching process.

16. The method of claim 15, wherein surface directional implantation process implants doping species along sidewalls of the opening extending in a single direction.

17. The method of claim 15, wherein the performing the surface directional implantation process includes modifying an etching characteristic of the hard mask layer, such that the implanted portion has a different etching resistance than the non-implanted portion.

18. The method of claim 15, wherein the etching process is a surface directional etching process that directs etching species in a substantially horizontal direction relative to a horizontal surface of the substrate.

19. The method of claim 15, wherein the implanted portion of the hard mask layer forms a sidewall mask along a sidewall of the opening.

20. The method of claim 1, wherein the surface directional etching process selectively etches the patterned hard mask layer relative to the wafer.

* * * * *